(12) United States Patent
Kim et al.

(10) Patent No.: US 8,897,089 B2
(45) Date of Patent: Nov. 25, 2014

(54) NONVOLATILE MEMORY DEVICES

(75) Inventors: JinTae Kim, Suwon-si (KR); Doogon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 521 days.

(21) Appl. No.: 13/323,275

(22) Filed: Dec. 12, 2011

(65) Prior Publication Data
US 2012/0170369 A1    Jul. 5, 2012

(30) Foreign Application Priority Data
Dec. 30, 2010   (KR) .................. 10-2010-0139481

(51) Int. Cl.
| | |
|---|---|
| G11C 16/28 | (2006.01) |
| G11C 16/30 | (2006.01) |
| H01L 27/115 | (2006.01) |
| H01L 29/792 | (2006.01) |
| G11C 16/04 | (2006.01) |

(52) U.S. Cl.
CPC .... *H01L 27/11582* (2013.01); *H01L 27/11573* (2013.01); *G11C 2216/14* (2013.01); *H01L 27/11578* (2013.01); *H01L 29/792* (2013.01); *G11C 16/0483* (2013.01); *H01L 27/11565* (2013.01)
USPC ...... 365/207; 365/185.05; 257/315; 257/316; 257/324; 257/E27.103; 257/E29.309

(58) Field of Classification Search
CPC ........ G11C 16/24; G11C 16/26; G11C 16/28; G11C 16/30; H01L 27/11286; H01L 27/11293; H01L 27/11517; H01L 27/11526; H01L 27/11529; H01L 27/11551; H01L 27/11563; H01L 27/11573; H01L 27/11578
USPC .................. 365/185.05, 207, 230.06, 230.08; 257/314–316, 324, E27.103, E29.3, 257/E29.309
See application file for complete search history.

(56) References Cited

U.S. PATENT DOCUMENTS

| | | | | |
|---|---|---|---|---|
| 6,373,753 | B1 * | 4/2002 | Proebsting | 365/189.09 |
| 6,377,502 | B1 * | 4/2002 | Honda et al. | 365/230.03 |
| 6,404,661 | B2 * | 6/2002 | Hidaka | 365/63 |
| 6,483,763 | B2 * | 11/2002 | Uchikoba et al. | 365/205 |
| 7,286,403 | B2 * | 10/2007 | Maejima | 365/185.17 |
| 7,504,724 | B2 * | 3/2009 | Futatsuyama | 257/750 |
| 7,542,321 | B2 | 6/2009 | Maejima et al. | |
| 2008/0225591 | A1 | 9/2008 | Hosono et al. | |
| 2009/0027941 | A1 | 1/2009 | Maejima et al. | |
| 2009/0290416 | A1 * | 11/2009 | Abe | 365/185.05 |

FOREIGN PATENT DOCUMENTS

| | | |
|---|---|---|
| JP | 2008-227171 A | 9/2008 |
| JP | 2009-033099 A | 2/2009 |
| KR | 2004-0078273 A | 9/2004 |
| KR | 10-0945839 B1 | 9/2008 |

* cited by examiner

*Primary Examiner* — Allison P Bernstein
(74) *Attorney, Agent, or Firm* — Harness, Dickey & Pierce, P.L.C.

(57) ABSTRACT

Nonvolatile memory devices including memory cell arrays with first bit line regions and common source tapping regions which are alternately disposed on a substrate along a direction, a page buffer including second bit line regions aligned with the first bit line regions and page buffer tapping regions aligned with the common source tapping regions, and a plurality of bit lines spaced apart from one another and extending to the second bit line regions from the first bit line regions.

20 Claims, 35 Drawing Sheets

NONVOLATILE MEMORY DEVICES

CROSS-REFERENCE TO RELATED APPLICATION

This application claims priority under 35 U.S.C. §119 to Korean Patent Application No. 10-2010-0139481, filed Dec. 30, 2010, in the Korean Intellectual Property Office (KIPO), the entire contents of which is incorporated herein by reference

BACKGROUND

1. Field

Example embodiments relate to semiconductor memory devices, and more particularly, to nonvolatile memory devices.

2. Description of the Related Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

A NAND flash memory device includes a planer flash memory device and a three-dimensional flash memory device. The planar flash memory device includes single-layer transistors which are formed on a substrate. The three-dimensional flash memory device includes multi-layer transistors which are formed on a substrate. The three-dimensional flash memory device has a higher integration density as compared with the planer flash memory device.

SUMMARY

Example embodiments of the inventive concepts may be directed to nonvolatile memory devices including a memory cell array with first bit line regions and common source tapping regions which are alternately disposed on a substrate along a specific direction, a page buffer including second bit line regions aligned with the first bit line regions and page buffer tapping regions aligned with the common source tapping regions, and a plurality of bit lines spaced apart one another and extended to the second bit line regions from the first bit line regions.

According to at least one example embodiment, at least one page buffer tapping line is provided at each of the page buffer tapping regions, the at least one page buffer tapping line being parallel with the plurality of bit lines and supplying a power to the page buffer. According to at least one example embodiment, the page buffer further includes a plurality of conductive lines spaced apart one another and extended to a direction perpendicular to the plurality of bit lines, the plurality of conductive lines being connected with page buffer tapping lines of the page buffer tapping regions via a plurality of contact plugs. According to at least one example embodiment, at least one page buffer tapping line supplying a power supply voltage and at least one page buffer tapping line supplying a ground voltage are provided at each of the page buffer tapping regions.

According to at least one example embodiment, at each of the page buffer tapping regions, a dummy bit line is further provided between adjacent two or more page buffer tapping lines. According to at least one example embodiment, when one page buffer tapping line is provided at each of the page buffer tapping regions, page buffer tapping lines of the page buffer tapping regions supply a power supply voltage and a ground voltage in turn along a direction perpendicular to the plurality of bit lines. According to at least one example embodiment, each of the page buffer tapping regions has a width narrower than or identical to that of each of the common source tapping regions.

According to at least one example embodiment, a width of each of the page buffer tapping regions is 10 times a width of each of the plurality of bit lines. According to at least one example embodiment, a width of each of the page buffer tapping regions is 8 times a width of each of the plurality of bit lines. According to at least one example embodiment, the memory cell array further includes a plurality of cell strings formed at each of the first bit line regions, each of the plurality of cell strings including a plurality of cell transistors stacked in a direction perpendicular to the substrate. According to at least one example embodiment, at least one common source tapping line supplying a power to a common source line of the plurality of cell strings is provided at each of the common source tapping regions.

According to at least one example embodiment, at least one common source tapping line supplying a power supply voltage and at least one common source tapping line supplying a ground voltage are provided at each of the common source tapping regions. According to at least one example embodiment, at each of the common source tapping regions, a dummy bit line is further provided between two or more adjacent common source tapping lines.

According to at least one example embodiment, when one common source tapping line is provided at each of the common source tapping regions, common source tapping lines of the common source tapping regions supply a power supply voltage and a ground voltage in turn along a direction perpendicular to the plurality of bit lines. According to at least one example embodiment, the memory cell array further includes a plurality of common source regions spaced apart one another and extended in a direction perpendicular to the plurality of bit lines, the plurality of common source regions forming the common source line.

According to other example embodiments a nonvolatile memory device includes bit line groups and tapping line groups disposed in turn along a specific direction. Each of the bit line groups includes a plurality of memory cell strings and a plurality of bit lines connected with a page buffer. Each of the tapping line groups includes at least one common source tapping line supplying a power to a common source line connected with the plurality of memory cell strings and at least one page buffer tapping line supplying a power to the page buffer.

According to at least one example embodiment, a nonvolatile memory device includes a memory cell array including a plurality of first bit line regions alternating with a plurality of common source tapping regions on a substrate, a page buffer including a plurality of second bit line regions aligned with the first bit line regions and a plurality of page buffer tapping regions aligned with the common source tapping regions, and a plurality of bit lines spaced apart from one another and extending to the second bit line regions from the first bit line regions.

According to at least one example embodiment, a nonvolatile memory device includes bit line groups alternating with tapping line groups, each of the bit line groups including a plurality of memory cell strings and a plurality of bit lines connected to a page buffer, each of the tapping line groups including at least one common source tapping line configured to supply power to a common source line connected to the plurality of memory cell strings, and at least one page buffer tapping line configured to supply power to the page buffer.

According to at least one example embodiment, a nonvolatile memory device includes a first mesh structure with a plurality of common source regions of a common source line extending in a first direction and a plurality of common source tapping lines extending in a second direction, the common source tapping lines connected to the common source regions at cross points.

BRIEF DESCRIPTION OF THE DRAWINGS

Example embodiments will be more clearly understood from the following brief description taken in conjunction with the accompanying drawings.

FIG. 1 is a block diagram illustrating nonvolatile memory devices according to example embodiments of the inventive concepts;

FIG. 2 is a perspective diagram illustrating a memory cell array and a page buffer of FIG. 1;

FIG. 3 is a plan view illustrating memory cell arrays and page buffers according to at least one example embodiment of the inventive concepts;

FIGS. 4 and 5 are plan views illustrating a memory cell array of FIG. 3 according to at least one example embodiment of the inventive concepts;

FIG. 6 is a cross sectional view taken along a line VI-VI' of FIG. 5 according to at least one example embodiment of the inventive concepts;

FIG. 7 is a cross sectional view taken along a line VII-VII' of FIG. 5;

FIG. 8 is a diagram illustrating a cell transistor of FIG. 6;

FIG. 9 is a circuit diagram illustrating an equivalent circuit of a part of a memory cell array;

FIGS. 10 and 11 are plan views of a page buffer of FIG. 3 according to other example embodiments of the inventive concepts;

FIG. 12 is a cross sectional view taken along a line XII-XII' of FIG. 11;

FIG. 13 is a cross-sectional view taken along a line VI-VI' of FIG. 5 according to at least some example embodiments of the inventive concepts;

FIG. 14 is a plan view of a memory cell array of FIG. 3 according to still other example embodiments of the inventive concepts;

FIG. 15 is a plan view of a page buffer of FIG. 3 according to yet still other example embodiments of the inventive concepts;

FIG. 16 is a plan view of a memory cell array of FIG. 3 according to further example embodiments of the inventive concepts;

FIG. 17 is a plan view of a page buffer of FIG. 3 according to still further example embodiments of the inventive concepts;

FIG. 18 is a plan view of a memory cell array of FIG. 3 according to yet further example embodiments of the inventive concepts;

FIG. 19 is a cross sectional view taken along a line XIX-XIX' of FIG. 18;

FIG. 20 is a plan view of a memory cell array of FIG. 3 according to yet still further example embodiments of the inventive concepts;

FIG. 21 is a cross sectional view taken along a line XXI-XXI' of FIG. 20;

FIG. 22 is a plan view of a memory cell array of FIG. 3 according to still yet further example embodiments of the inventive concepts;

FIG. 23 is a cross sectional view taken along a line XXIII-XXIII' of FIG. 22;

FIG. 24 is a plan view illustrating a memory cell array of FIG. 3 according to still yet other example embodiments of the inventive concepts;

FIG. 25 is a perspective view taken along a line XXV-XXV' of FIG. 24;

FIG. 26 is a cross-sectional view taken along a line XXVI-XXVI' of FIG. 24;

FIG. 27 is a plan view illustrating a memory cell array and page buffer of FIGS. 1 and 2 according to even further example embodiments of the inventive concepts;

FIG. 28 is a plan view illustrating a memory cell array of FIG. 27 according to at least one example embodiment of the inventive concepts;

FIG. 29 is a cross-sectional view taken along a line XXIX-XXIX' of FIG. 28;

FIG. 30 is a cross-sectional view taken along a line XXIX-XXIX' of FIG. 28 according to at least one example embodiment of the inventive concepts;

FIG. 31 is a plan view illustrating a memory cell array in FIG. 27 according to even other example embodiments of the inventive concepts;

FIG. 32 is a cross-sectional view taken along a line XXXII-XXXII' of FIG. 31;

FIG. 33 is a block diagram illustrating memory systems according to at least one example embodiment of the inventive concepts;

FIG. 34 is a block diagram illustrating applications of a memory system of FIG. 33; and FIG. 35 is a block diagram illustrating computing systems including a memory system of FIG. 34.

Figure 1:
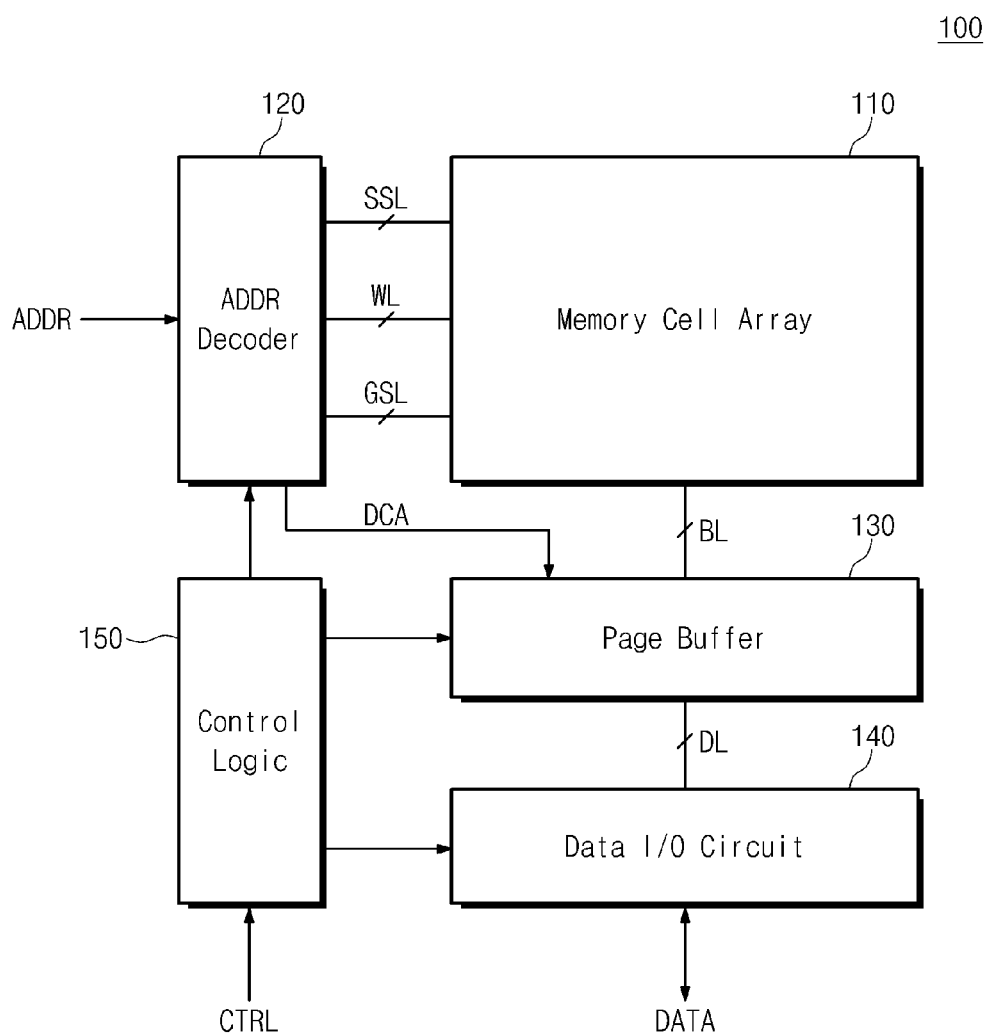
FIGS. 1-35 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating nonvolatile memory devices according to example embodiments. Referring to FIG. 1, a nonvolatile memory device 100 may include a memory cell array 110, an address decoder 120, a page buffer circuit 130, a data input/output circuit 140 and control logic 150. The memory cell array 110 may include a plurality of memory cell groups. For example, the memory cell array 110 may include a plurality of cell strings which may be arranged on a substrate along row and column directions. Each cell string may include a plurality of memory cells stacked along a direction perpendicular to the substrate. The memory cells may be provided on the substrate along rows and columns and may be stacked in a direction perpendicular to the substrate to form a three-dimensional structure. According to at least one example embodiment, each memory cell of the memory cell array 110 may store one or more bits of data.

The address decoder 120 may be coupled with the memory cell array 110 via word lines WL, string selection lines SSL, and ground selection lines GSL. The address decoder 120 may be configured to operate responsive to the control of the control logic 150. The address decoder 120 may receive an address ADDR from an external device. The address decoder 120 may be configured to decode a row address of the input address ADDR. The address decoder 120 may be configured to select a word line corresponding to a decoded row address of the word lines WL. The address decoder 120 may be configured to select a string selection line SSL and a ground selection line GSL corresponding to the decoded row address of the string selection lines and the ground selection lines.

The address decoder 120 may be configured to decode a column address of the input address ADDR. The address decoder 120 may provide the decoded column address DCA to the page buffer circuit 130. According to at least one example embodiment, the address decoder 120 may include a row decoder decoding a row address, a column decoder decoding a column address, and an address buffer storing the input address ADDR. The page buffer circuit 130 may be coupled with the memory cell array 110 via bit lines BL and with the data input/output circuit 140 via data lines DL. The page buffer circuit 130 may operate responsive to the control of the control logic 150. The control logic 150 may operate responsive to a control signal CTRL. The page buffer circuit 130 may select the bit lines BL in response to the decoded column address DCA provided from the address decoder 120.

According to at least one example embodiment, the page buffer circuit 130 may receive data from the data input/output circuit 140 to write it to the memory cell array 110. The page buffer circuit 130 may read data from the memory cell array 110 to output it to the data input/output circuit 140. The page buffer circuit 130 may read data from a first storage area of the memory cell array 110 to write it in a second storage area thereof. The page buffer circuit 130 may perform a copy-back operation. The data input/output circuit 140 may be connected with the page buffer circuit 130 via the data lines DL.

The data input/output circuit 140 may operate responsive to the control logic 150. The data input/output circuit 140 may be configured to exchange data with the page buffer circuit 130 via the data lines DL. The data input/output circuit 140 may be configured to exchange data with an external device. The data input/output circuit 140 may include a data buffer. The control logic 150 may be coupled with the address decoder 120, the read/write circuit 130, and the data input/output circuit 140. The control logic 150 may be configured to control an overall operation of the nonvolatile memory device 100.

Figure 2:
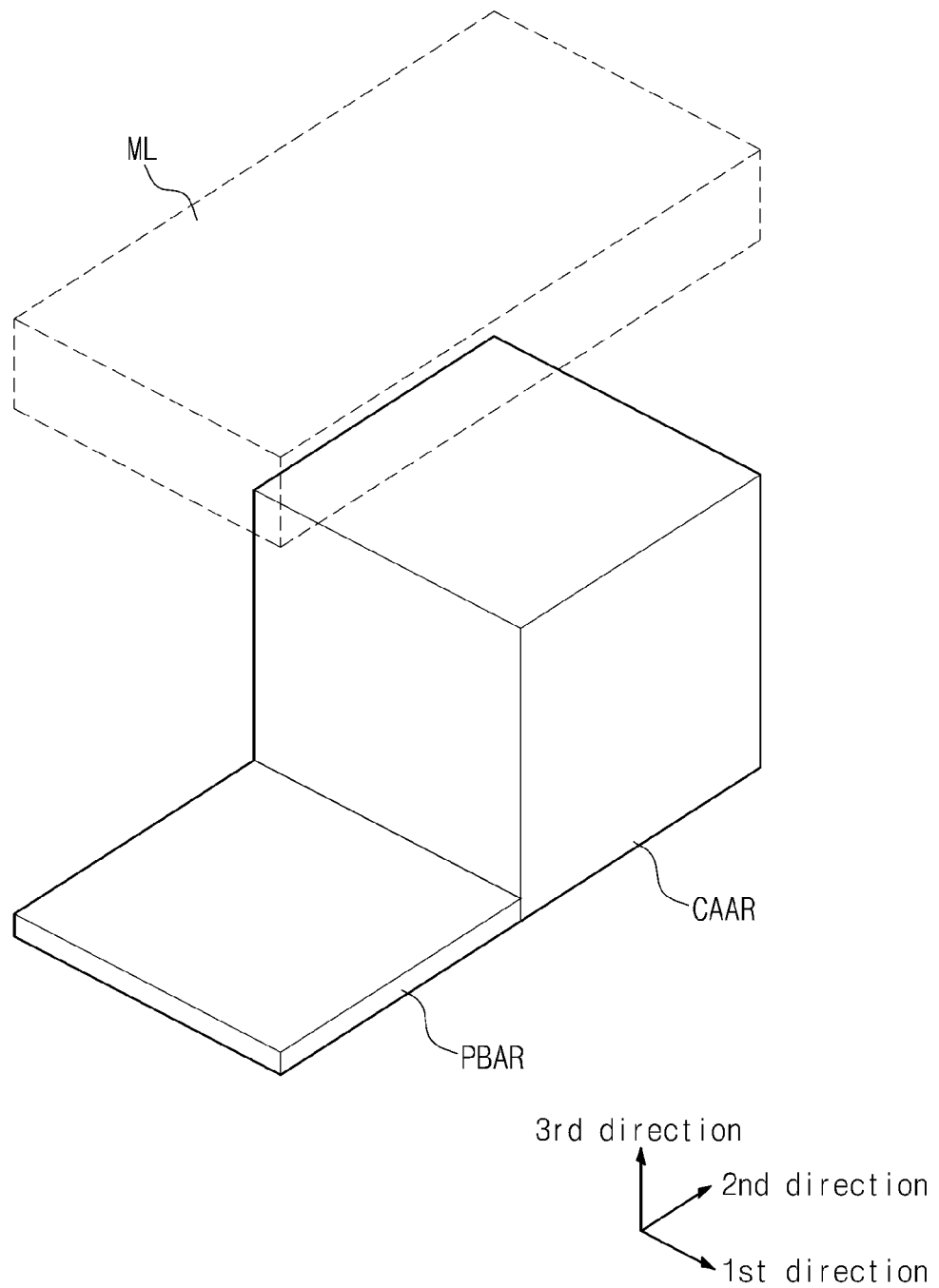

FIG. 2 is a perspective diagram illustrating a memory cell array and a page buffer of FIG. 1. Referring to FIG. 2, there may be a cell array active region CAAR and a page buffer active region PBAR. The cell array active region CAAR may be an active region of a memory cell array 110 that may be formed on a substrate. The cell array active region CAAR may extend along first to third directions. The cell array active region CAAR may have a three-dimensional structure where at least two cell transistors may be stacked. The page buffer active region PBAR may be an active region of a page buffer 130 formed on the substrate. The page buffer active region PBAR may extend along the first to third directions. A height of the page buffer active region PBAR may be less than that of the cell array active region CAAR. According to at least one example embodiment, the page buffer active region PBAR may be a planar structure including single-layer transistors on the substrate.

A metal layer ML may be provided on the cell array active region CAAR and the page buffer active region PBAR. The metal layer ML may be a single layer or multiple layers. The metal layer ML may be connected with the cell array active region CAAR and the page buffer active region PBAR via a plurality of contact plugs. The cell array active region CAAR and the page buffer active region PBAR may be interconnected via the metal layer ML.

Figure 3:
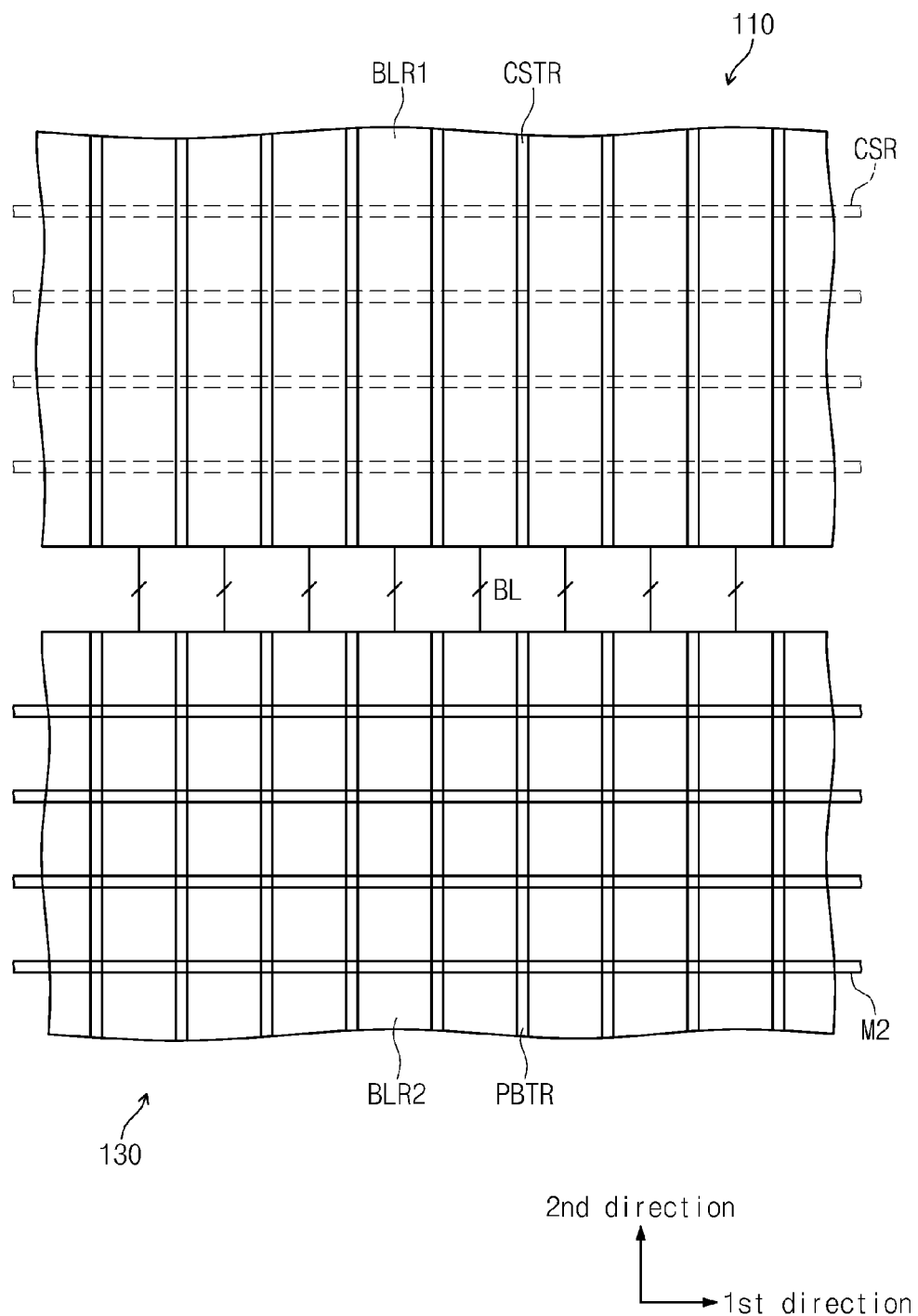

FIG. 3 is a plan view illustrating memory cell arrays and page buffers according to at least one example embodiment. Referring to FIG. 3, a memory cell array 110 may include a plurality of first bit line regions BLR1 and common source tapping regions CSTR which are alternately disposed along a first direction. The first bit line regions BLR1 and the common source tapping regions CSTR may extend along a second direction. The first bit line regions BLR1 may be spaced apart along the first direction. The common source tapping regions CSTR may be spaced apart along the first direction. The memory cell array 110 may include a plurality of common source regions CSR which may extend along the first direction and may be spaced apart along the second direction. The common source regions CSR may be interconnected to form a common source line of the memory cell array 110.

The page buffer 130 may include a plurality of second bit line regions BLR2 and page buffer tapping regions PBTR. The second bit line regions BLR2 and the page buffer tapping regions PBTR may extend along the second direction. The second bit line regions BLR2 may be spaced apart along the first direction. The page buffer tapping regions PBTR may be spaced apart along the first direction. The page buffer 130 may include a plurality of conductive lines M2 which may extend along the first direction and may be spaced apart along the second direction. The second bit line regions BLR2 may be aligned with the first bit line regions BLR1, and the page buffer tapping regions PBTR may be aligned with the common source tapping regions CSTR. The page buffer tapping regions PBTR may be along the second direction on an extension of the common source tapping regions CSTR.

A plurality of bit lines may be formed at the first bit line regions BLR1. The bit lines may be spaced apart along the first direction and extend along the second direction. The bit lines formed at the first bit line regions BLR1 may be extended to the second bit line regions BLR2 along the second direction. At least one common source tapping line (not shown) may be provided at each of the common source tapping regions CSTR. The common source tapping lines provided at the common source tapping regions CSTR may extend along the second direction and supply a power to the plurality of common source regions CSR.

The common source tapping lines (not shown) may be connected with the common source regions CSR. Power may be supplied to the common source line of the memory cell array 110 via the common source tapping regions CSTR arranged along the first direction and the common source tapping lines extending along the second direction. Because power may be supplied via a mesh structure, a power of the common source line of the memory cell array 110 may be stabilized. It may be possible to improve the reliability of a nonvolatile memory device.

At least one page buffer tapping line (not shown) may be provided at each of the page buffer tapping regions PBTR. The at least one page buffer tapping line (not shown) may extend along the second direction and supply a power to the page buffer 130. The at least one page buffer tapping line (not shown) may be connected with a plurality of conductive lines M2. Power may be supplied to the page buffer 130 via the conductive lines M2 extending along the first direction and the page buffer tapping lines extending along the second direction. Because power may be supplied via a mesh structure, a power of the page buffer 130 may be stabilized. It may be possible to improve the reliability of a nonvolatile memory device. For example, the page buffer tapping lines and the common source tapping lines may have the same structure, or may have different structures.

Figure 4:
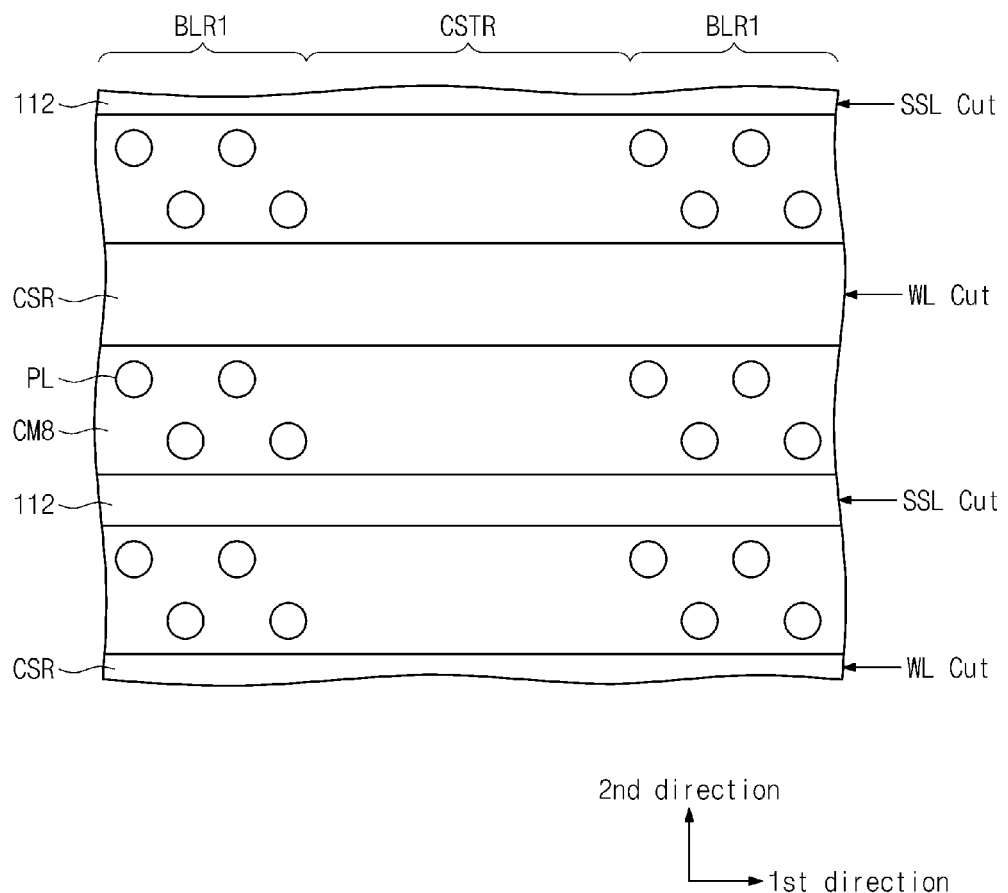
Figure 5:
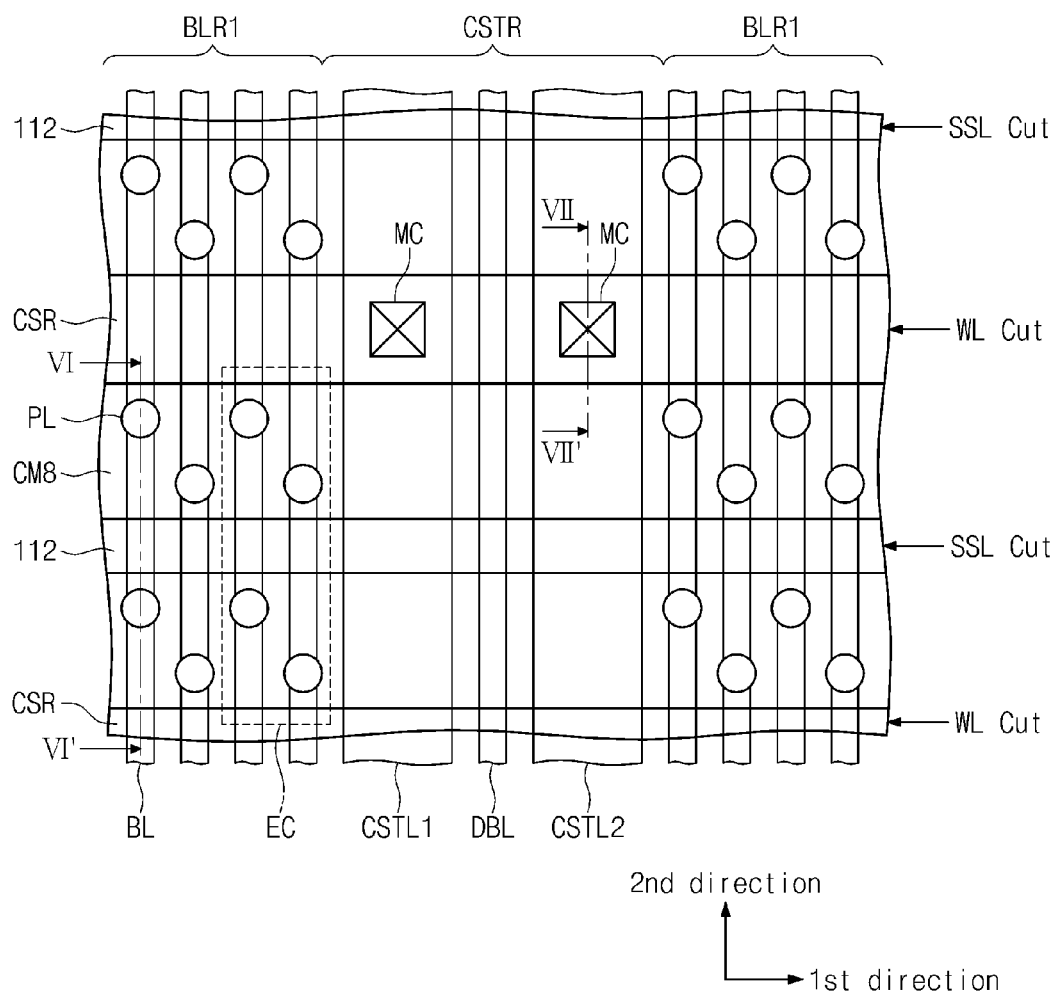
Figure 6:
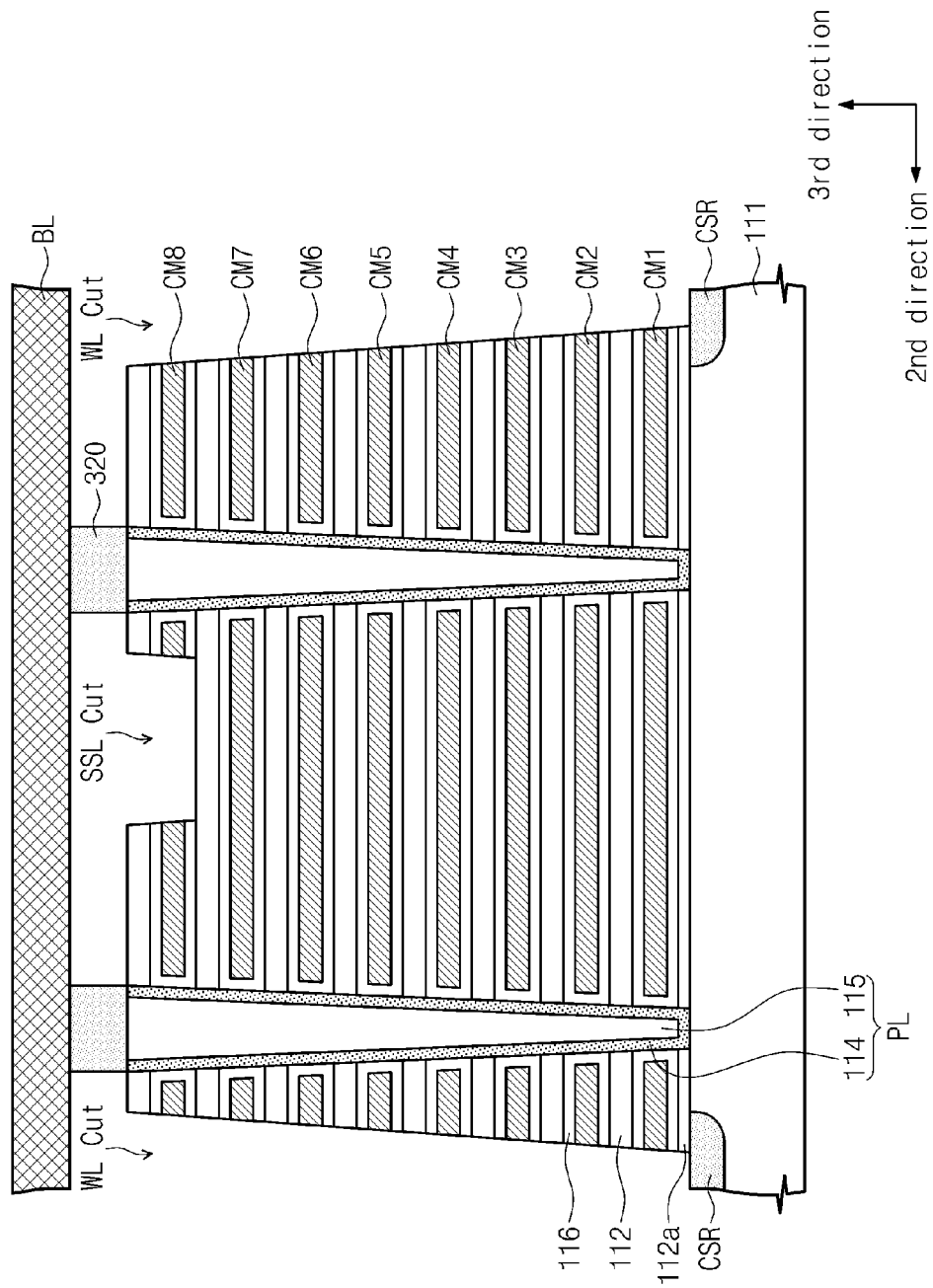
Figure 7:
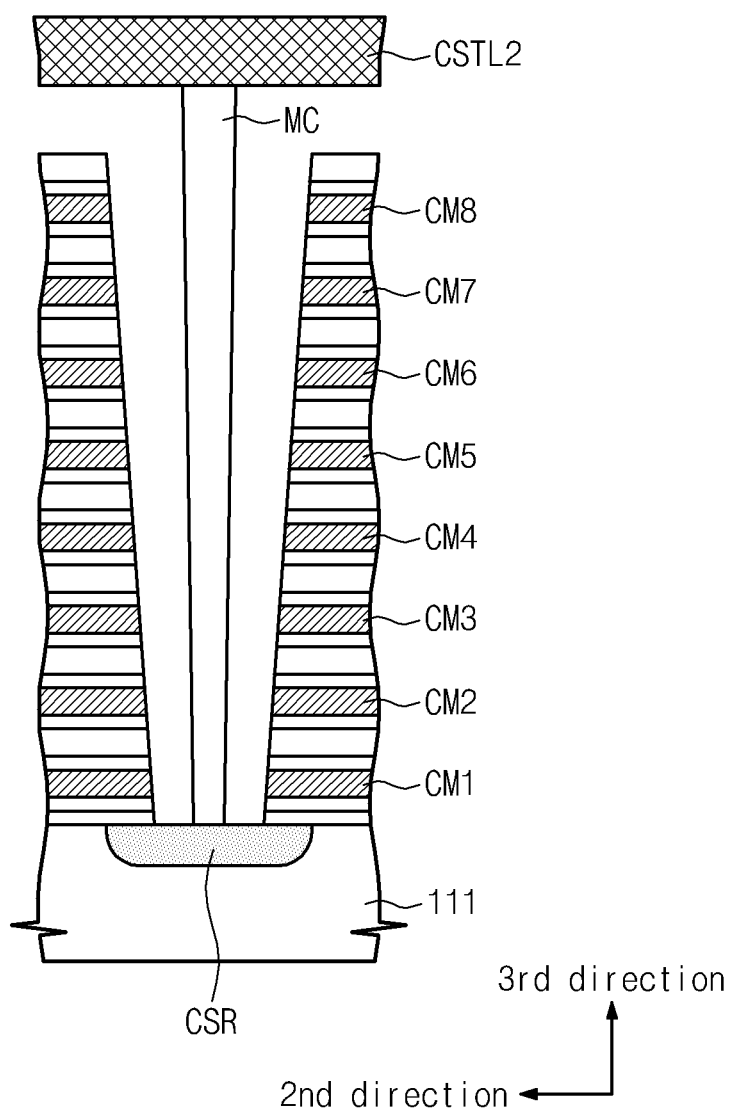

FIGS. 4 and 5 are plan views illustrating a memory cell array of FIG. 3 according to at least one example embodiment. FIG. 6 is a cross sectional view taken along a line VI-VI' of FIG. 5 according to at least one example embodiment of the inventive concepts. FIG. 7 is a cross sectional view taken along a line VII-VII' of FIG. 5. According to at least one example embodiment, a plan view of a part of a cell array active region CAAR (refer to FIG. 2) is illustrated in FIG. 4. A plan view of the cell array active region CAAR, bit lines BL on the cell array active region CAAR, and common source tapping lines is partially illustrated in FIG. 5.

Referring to FIGS. 4-7, a cell array active region CAAR may include structures extending along first to third directions. A substrate 111 may be provided. For example, the substrate 111 may be a well of a first conductive type. The substrate 111 may be, for example, a p-well in which the Group III element such as boron may be injected. The substrate 111 may be a pocket p-well which is provided within an n-well. Below, it may be assumed for purposes of explanation that the substrate 111 is a p-well (or, a pocket p-well). However, the substrate 111 may not be limited to a p-type substrate.

A plurality of common source regions CSR extending along the first direction may be provided in the substrate 111. The common source regions CSR may be spaced apart along the second direction. The common source regions CSR may be provided over first bit line regions BLR1 and common source tapping regions CSTR. The common source regions CSR may be a second conductive type that is different from that of the substrate 111. For example, the common source regions CSR may be n-type. Below, it may be assumed for purposes of explanation that the common source regions CSR may be n-type. However, the common source regions CSR may not be limited to n-type.

Between adjacent common source regions of the common source regions CSR, a plurality of first insulation materials 112 and 112a may be provided sequentially along the second direction (a direction perpendicular to the substrate 111). The first insulation materials 112 and 112a may be formed to be spaced apart along the third direction. According to at least one example embodiment, the first insulation materials 112 and 112a may extend along the first direction. For example, the first insulation materials 112 and 112a may include an insulation material, for example, a silicon oxide. According to at least one example embodiment, the first insulation material 112a contacting with the substrate 111 may be thinner than the first insulation materials 112.

Between adjacent common source regions of the common source regions CSR and at the first bit line regions BLR1, a plurality of pillars PL may be arranged sequentially along the first direction to penetrate the plurality of first insulation materials 112 and 112a along the third direction. For example, the pillars PL may contact with the substrate 111 through the first insulation materials 112 and 112a. According to at least one example embodiment, the pillars PL may each include a plurality of materials. For example, the pillars PL may include channel films 114 and inner materials 115 placed in the channel films 114. According to at least one example embodiment, two pillars may be provided between two adjacent common source regions along a bit line direction.

The channel films 114 may include a semiconductor material (e.g., silicon) of the first conductive type. For example, the channel films 114 may include a semiconductor material (e.g., silicon) of the same conductive type as the substrate 111. For example, the channel films 114 may include intrinsic semiconductor of no conductive type. The inner materials 115 may include an insulation material. For example, the inner materials 115 may include an insulation material (e.g., a silicon oxide). The inner materials 115 may include an air gap. Information storage films 116 may be between adjacent common source regions of the common source regions CSR along exposed surfaces of the first insulation materials 112 and 112a and the pillars. The information storage films 116 may store information by trapping or discharging charges.

Between adjacent common source regions, conductive materials CM1-CM8 may be on exposed surfaces of the information storage films 116. For example, the conductive materials CM1-CM8 extending along the first direction may be between the information storage films 116. The conductive materials CM1-CM8 may be separated on the common source regions CSR by a word line cut WL Cut. The word line cut WL Cut may extend along the first direction. Between adjacent common source regions, at least one uppermost conductive material CM8 of the conductive materials CM1-CM8 may be separated by a string selection line cut SSL Cut.

According to at least one example embodiment, between adjacent common source regions, the string selection line cut SSL Cut may be between pillars disposed along a bit line direction.

According to at least one example embodiment, the conductive materials CM1-CM8 may include a metallic conductive material. The conductive materials CM1-CM8 may include a non-metallic conductive material, for example, polysilicon. According to at least one example embodiment, information storage films that may be on an upper surface of an insulation material placed at the uppermost layer among the insulation materials 112 and 112a may be removed. For example, information storage films that may be provided at sides opposite to the pillars PL among sides of the insulation materials 112 and 112a may be removed.

A plurality of drains 320 may be provided on the plurality of pillars PL. The drains 320 may include a semiconductor material (e.g., silicon) of the second conductivity type, for example. The drains 320 may include an n-type semiconductor material (e.g., silicon). Below, it may be assumed for purposes of explanation that the drains 320 include n-type silicon. However, the example embodiments of the inventive concepts may not be limited thereto. The drains 320 may extend to the upper side of the channel films 114 of the pillars PL. At the first bit line regions BLR1, bit lines BL extending in the second direction may be on the drains 320 so as to be spaced apart from one another along the first direction. The bit lines BL may be coupled with the drains 320.

According to at least one example embodiment, the drains 320 and the bit lines BL may be connected via contact plugs (not shown). The bit lines BL may extend along the second direction up to second bit line regions BLR2 of a page buffer 130. According to at least one example embodiment, the bit lines BL may be formed at a metal layer ML (refer to FIG. 2). The bit lines BL may be formed at a first metal layer. The bit lines BL may include a metallic material. According to at least one example embodiment, the word line cut WL Cut and the string selection line cut SSL Cut may be alternately arranged along the second direction. The pillars PL may be in a zigzag pattern along the first direction at the conductive materials CM1-CM8 extending along the first direction, for example.

Common source tapping lines CSTL1 and CSTL2 extending along the second direction may be at common source tapping regions CSTR. The common source tapping lines CSTL1 and CSTL2 may be spaced apart along the first direction. A dummy bit line DBL may be between the common source tapping lines CSTL1 and CSTL2. The common source tapping lines CSTL1 and CSTL2 and the dummy bit line DBL may be at a metal layer ML. The common source tapping lines CSTL1 and CSTL2 and the dummy bit line DBL may be at the same layer as the bit lines BL. The common source tapping lines CSTL1 and CSTL2 and the dummy bit line DBL may be at the first metal layer.

The common source tapping lines CSTL1 and CSTL2 may be connected with the common source regions CSR via metal contacts MC. According to at least one example embodiment, two common source tapping lines CSTL1 and CSTL2 may be at the common source regions CSR. A first common source tapping line CSTL1 may supply a power supply voltage to the common source regions CSR, and a second common source tapping line CSTL2 may supply a ground voltage to the common source regions CSR. The first common source tapping line CSTL1 may supply the ground voltage to the common source regions CSR, and the second common source tapping line CSTL2 may supply the power supply voltage to the common source regions CSR.

A common source line may be powered via the common source regions CSR extending along the first direction and the common source tapping lines CSTL1 and CSTL2 extending along the second direction. The common source line of a memory cell array 110 may be powered via the common source regions CSR and the common source tapping lines CSTL1 and CSTL2 which may be arranged in a mesh structure. A voltage of the common source line may be stabilized.

The conductive materials CM1-CM8 may be of first to eighth heights according to a distance from the substrate 111. The pillars PL may constitute one cell string with the information storage films 116 and the conductive materials CM1-CM8. The pillars PL may constitute a plurality of cell strings with the information storage films 116 and adjacent conductive materials CM1-CM8. The pillars PL may be arranged on the substrate 111 along row and column directions. The memory cell array 110 may include a plurality of cell strings on the substrate 111 along the row and column directions. Each of cell strings may include a plurality of cell transistors CT (see FIG. 8) that may be stacked in a direction perpendicular to the substrate 111.

Figure 8:
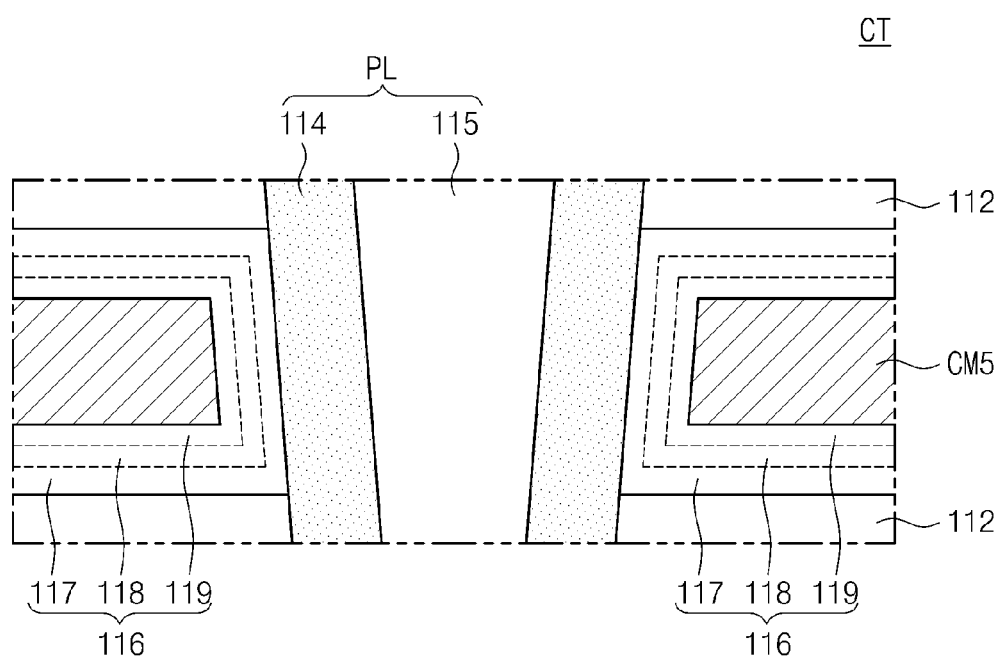

FIG. 8 is a diagram illustrating a cell transistor of FIG. 6. Referring to FIGS. 4-8, cell transistors CT may include conductive materials CM1-CM8, portions of pillars PL corresponding to the conductive materials CM1-CM8, and information storage films 116 between the conductive material CM1-CM8 and the pillars PL. The information storage films 116 may extend to upper surfaces and lower surfaces of the conductive materials CM 1-CM8 from regions between the conductive materials CM1-CM8 and the pillars PL. Each of the information storage films 116 may include first to third sub insulation films 117, 118, and 119.

In the cell transistors CT, the channel films 114 of the pillars PL may include the same p-type silicon as the substrate 111. The channel films 114 may act as bodies of cell transistors CT. The channel films 114 may be in a direction perpendicular to the substrate 111. The channel films 114 may act as a vertical body. Vertical channels may be formed at the channel films 114. The first sub insulation films 117 adjacent to the pillars PL may act as tunneling insulation films of the cell transistors CT. For example, the first sub insulation films 117 adjacent to the pillars PL may include a thermal oxide film. The first sub insulation films 117 may include, for example, a silicon oxide film.

The second sub insulation films 118 may act as charge storage films of the cell transistors CT. For example, the second sub insulation films 118 may act as a charge trap film. For example, the second sub insulation films 118 may include a nitride film and/or a metal oxide film (e.g., an aluminum oxide film and/or a hafnium oxide film). The third sub insulation films 119 adjacent to the conductive materials CM1-CM8 may act as blocking insulation films of the cell transistors CT. According to at least one example embodiment, the third sub insulation films 119 may be a single layer or multiple layers. The third sub insulation films 119 may be a high dielectric film (e.g., an aluminum oxide film and/or a hafnium oxide film) with a dielectric constant that may be larger than those of the first and second sub insulation films 117 and 118. The third sub insulation films 119 may include a silicon oxide film.

According to at least one example embodiment, the first to third sub insulation films 117-119 may constitute ONO (oxide-nitride-oxide). The plurality of conductive materials CM1-CM8 may act as gates (or, control gates). The plurality of conductive materials CM1-CM8 acting as gates (or, control gates), the third sub insulation films 119 acting as block insulation films, the second sub insulation films 118 acting as charge storage films, the first sub insulation films 117 acting as tunneling insulation films, and the channel films 114 acting as vertical bodies may constitute cell transistors CT. For example, the cell transistors CT may be a charge trap type cell transistor.

The cell transistors CT may be used for different purposes according to height. For example, among the cell transistors CT, at least one cell transistor at an upper portion may be used as a string selection transistor. Among the cell transistors CT, at least one cell transistor placed at a lower portion may be used as a ground selection transistor. Remaining cell transistors may be used as a memory cell and a dummy memory cell, for example. The conductive materials CM1-CM8 may extend along the first direction so that they may be connected with a plurality of pillars PL. The conductive materials CM1-CM8 may interconnect cell transistors CT of the pillars PL. According to at least one example embodiment, the conductive materials CM1-CM8 may be used as a string selection line, a ground selection line, a word line, and/or a dummy word line according to height.

Figure 9:
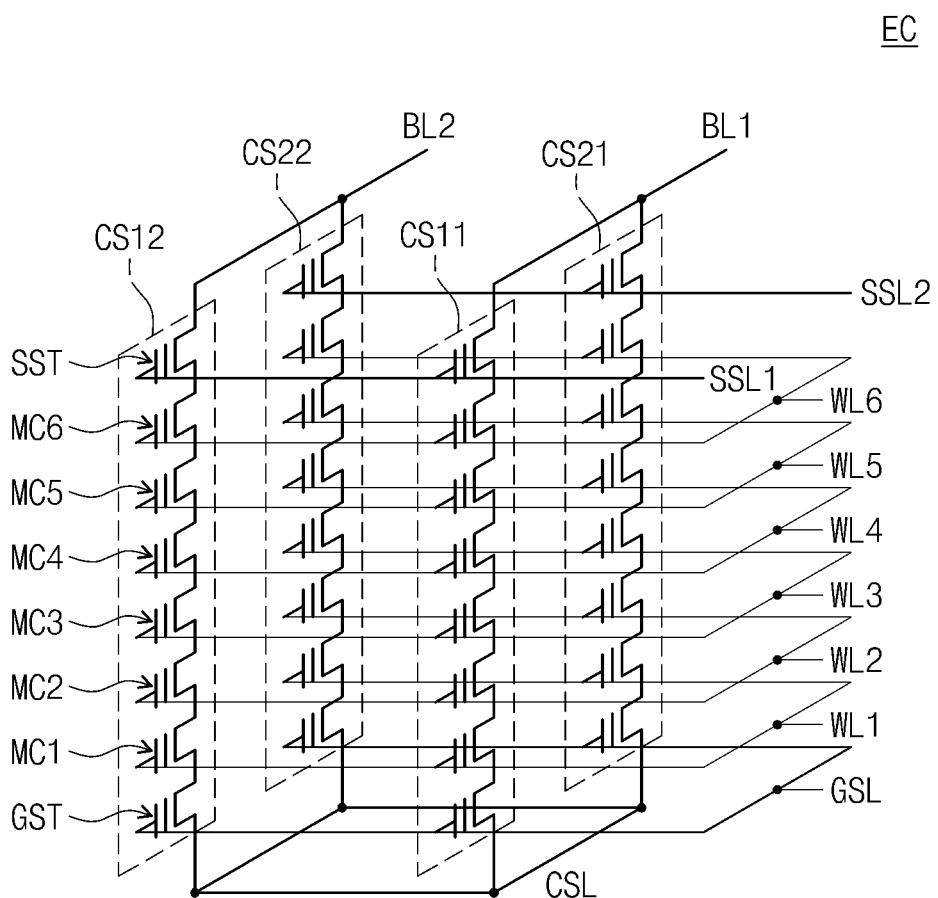

FIG. 9 is a circuit diagram illustrating an equivalent circuit of a part EC of a memory cell array. Referring to FIGS. 4-9, cell strings CS11, CS21, CS12, and CS22 may be between bit lines BL1 and BL2 and a common source line CSL. The cell strings CS11 and CS21 may be connected between a first bit line BL1 and the common source line CSL, and cell strings CS12 and CS22 may be connected between a second bit line BL2 and the common source line CSL. Common source regions CSR may be interconnected to form the common source line CSL.

The cell strings CS11, CS21, CS12 and CS22 may correspond to four pillars of a part EC of a memory cell array 110. The pillars PL may constitute the cell strings CS11, CS21, CS12, and CS22 with conductive materials CM1-CM8 and information storage films 116. According to at least one example embodiment, first conductive materials CM1 may be ground selection transistors GST with the information storage films 116 and the pillars PL. The first conductive materials CM1 may be a ground selection line GSL. The first conductive materials CM1 may be interconnected to form a ground selection line GSL. Second to seventh conductive materials CM2-CM7 may be first to sixth memory cells MC1-MC6 with the information storage films 116 and the pillars PL. The second to seventh conductive materials CM2-CM7 may constitute first to sixth word lines WL1-WL6.

The second conductive materials CM2 may be interconnected to form the first word line WL1. The third conductive materials CM3 may be interconnected to form the second word line WL2. The fourth conductive materials CM4 may be interconnected to form the third word line WL3. The fifth conductive materials CM5 may be interconnected to form the fourth word line WL4. The sixth conductive materials CM6 may be interconnected to form the fifth word line WL5. The seventh conductive materials CM7 may be interconnected to form the sixth word line WL6.

Eighth conductive materials CM8 may be string selection transistors SST with the information storage films 116 and the pillars PL. The eighth conductive materials CM8 may constitute string selection lines SSL1 and SSL2. Memory cells of the same height may be connected in common with one word line. When a word line with a specific height is selected, all cell strings CS11, CS12, CS21 and CS22 connected with the selected word line may be selected. Cell strings of different rows may be connected with different string selection lines. Accordingly, in the cell strings CS11, CS12, CS21, and CS22 connected with the same word line, an unselected row of cell strings CS11 and CS12 or CS21 and CS22 may be electrically separated from the bit lines BL1 and BL2 by selecting and unselecting the first and second string selection lines SSL1 and SSL2.

A selected row of cell strings CS21 and CS22 or CS11 and CS12 may be electrically connected with the bit lines BL1 and BL2. Rows of the cell strings CS11, CS12, CS21, and CS22 may be selected by selecting and unselecting the first and second string selection lines SSL1 and SSL2. Columns of cell strings in a selected row may be selected by selecting the bit lines BL1 and BL2. According to at least one example embodiment, at least one of the word lines WL1-WL6 may be used as a dummy word line. For example, a word line adjacent to the string selection lines SSL1 and SSL2, a word line adjacent to the ground selection line GSL, and/or at least one of word lines between the string selection lines SSL1 and SSL2 and the ground selection line GSL may be used as a dummy word line.

According to at least one example embodiment, at least two conductive materials of the conductive materials CM1-CM8 may be string selection lines. For example, the seventh and eighth conductive materials CM7 and CM8 may be used as string selection lines. The seventh and eighth conductive materials CM7 and CM8 in the same row may be connected in common. According to at least one example embodiment, at least two conductive materials of the conductive materials CM1-CM8 may be a ground selection line. For example, the first and second conductive materials CM1 and CM2 may be used as a ground selection line. The first and second conductive materials CM1 and CM2 in the same row may be connected in common. According to at least one example embodiment, the first conductive materials CM1 may be two ground selection lines that are electrically separated.

Figure 10:
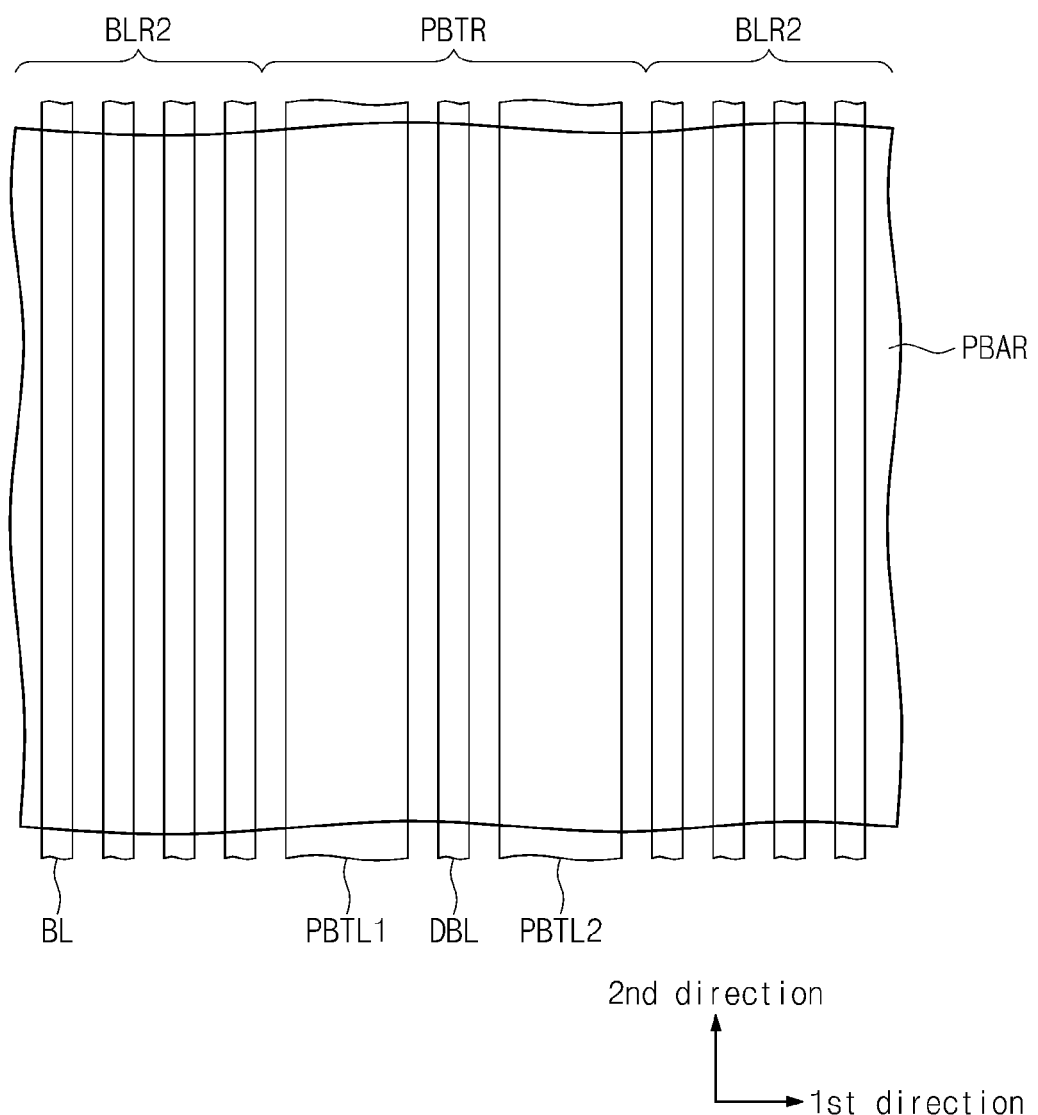
Figure 11:
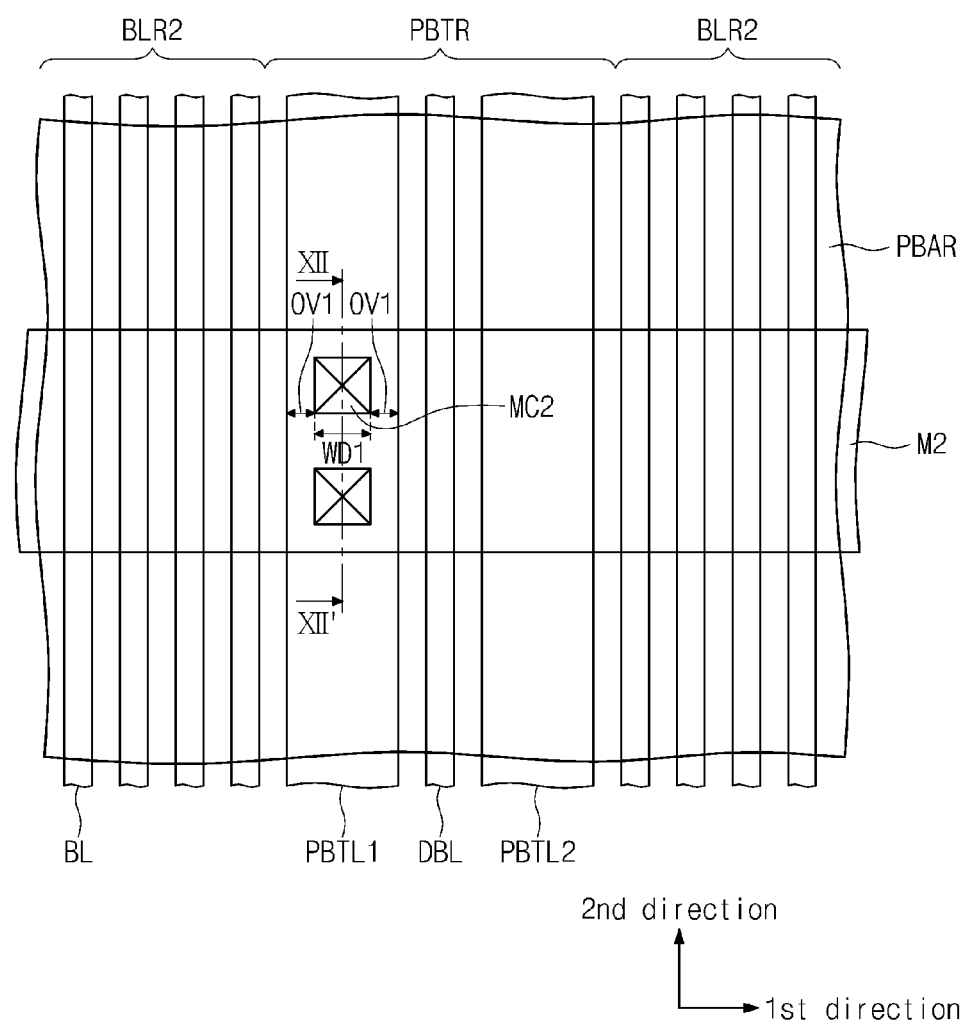

FIGS. 10 and 11 are plan views of a page buffer 130 of FIG. 3 according to other example embodiments. According to at least one example embodiment, a page buffer active region PBAR and bit lines BL, page buffer tapping lines PBTL1 and PBTL2, and a dummy bit line DBL on the page buffer active region PBAR are illustrated in FIG. 10. A cross sectional view of a structure in FIG. 10 on which conductive lines M2 are added is illustrated in FIG. 11.

Figure 12:
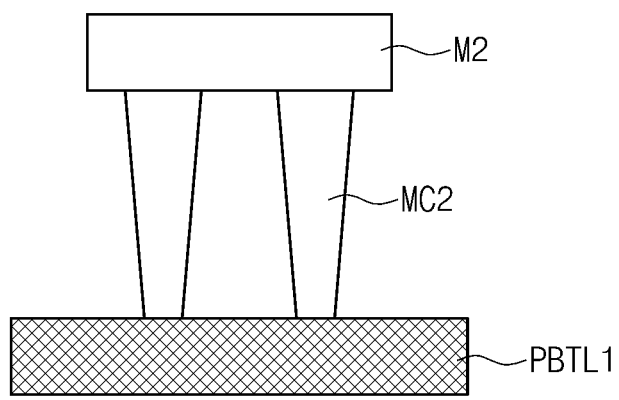
Figure 12:
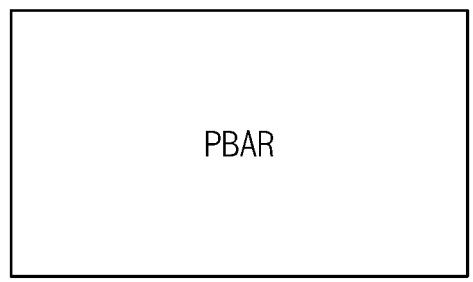

FIG. 12 is a cross sectional view taken along a line XII-XII' of FIG. 11. Referring to FIGS. 10-12, bit lines BL may be formed on second bit line regions BLR2 of a page buffer active region PBAR. According to at least one example embodiment, the bit lines BL may extend from first bit line regions BLR1 of a memory cell array 110. Page buffer tapping lines PBTL1 and PBTL2 may be at the page buffer tapping regions PBTR. The page buffer tapping lines PBTL1 and PBTL2 may be spaced apart along a first direction and extend along a second direction.

According to at least one example embodiment, two page buffer tapping lines PBTL1 and PBTL2 may be at one page buffer tapping region PBTR. The first page buffer tapping line PBTL1 may supply a power supply voltage to the page buffer active region PBAR, and the second page buffer tapping line PBTL2 may supply a ground voltage to the page buffer 130. The first page buffer tapping line PBTL1 may supply the ground voltage to the page buffer active region PBAR, and the second page buffer tapping line PBTL2 may supply the power supply voltage to the page buffer 130.

A dummy bit line DBL may be between the page buffer tapping lines PBTL1 and PBTL2. The page buffer tapping lines PBTL1 and PBTL2 and the dummy bit line DBL may be at a metal layer ML. The page buffer tapping lines PBTL1 and PBTL2 and the dummy bit line DBL may be at the same layer as the bit lines. The page buffer tapping lines PBTL1 and PBTL2 and the dummy bit line DBL may be at a first metal layer. Conductive lines M2 may be on the page buffer tapping lines PBTL1 and PBTL2. The conductive lines M2 may be spaced apart along the second direction and extend along the first direction. The conductive lines M2 may be at a second metal layer. The page buffer tapping lines PBTL1 and PBTL2 may be connected with the conductive lines M2 via a plurality of second metal contacts MC2.

According to at least one example embodiment, power may be supplied to the page buffer active region PBAR via the conductive lines M2 extending along the first direction. The conductive lines M2 may supply a power supply voltage and a ground voltage in turn along the second direction. The page buffer tapping lines supplying a power supply voltage may be connected with the conductive lines M2 supplying a power supply voltage. The page buffer tapping lines supplying a ground voltage may be connected with the conductive lines M2 supplying a ground voltage.

Power may be supplied to the page buffer active region PBAR by the second conductive lines M2 extending along the first direction and the page buffer tapping lines PBTL1 and PBTL2 extending along the second direction. A page buffer 130 may be supplied with power by the second conductive lines M2 and the page buffer tapping lines PBTL1 and PBTL2 which may be mesh structured. A power of the page buffer 130 may be stabilized.

The page buffer tapping regions PBTR may be aligned with the common source tapping regions CSTR. The page buffer tapping regions PBTR may be at a location where the common source tapping regions CSTR may be. There may not be required a separate space where the page buffer tapping regions PBTR are formed. According to at least one example embodiment, widths of the page buffer tapping region PBTR and the common source tapping region CSTR may be determined in accordance with a width of each of the page buffer tapping lines PBTL1 and PBTL2. At the page buffer 130, a size of the second metal contacts MC2 for connecting the page buffer tapping lines PBTL1 and PBTL2 and the conductive lines M2 may be determined in accordance with a fabricating process.

At the fabricating process, a width WD1 of the second metal contacts MC2 and a minimum value of distances OV1 (hereinafter, referred to as 'overlap') between the second metal contacts MC2 and the page buffer tapping lines PBTL1 and PBTL2 may be determined. At fabrication of the page buffer 130, the width WD1 of the second metal contacts MC2 and the overlaps OV1 may be over a minimum value. A width of the page buffer tapping lines PBTL1 and PBTL2 may be limited over double a sum of a minimum value of the width WD1 of the second metal contacts MC2 and a minimum value of the width of the page buffer tapping lines PBTL1 and PBTL2.

In a specific fabricating process, a minimum value of a width of bit lines BL and a minimum value of an interval between bit lines BL may be defined. Intervals between the page buffer tapping lines PBTL1 and PBTL2 and adjacent bit lines BL may be over a minimum value. Intervals between the page buffer tapping lines PBTL1 and PBTL2 and the dummy bit line DBL may be over a minimum value. A width of the dummy bit line DBL may be over a minimum value. A width of the page buffer tapping regions PBTR may be determined such that intervals between the page buffer tapping lines PBTL1 and PBTL2 and the bit lines BL, intervals between the page buffer tapping lines PBTL1 and PBTL2 and the dummy bit line DBL, and a width of the dummy bit line are over a minimum value.

If a width of the page buffer tapping regions PBTR is determined, a width of the common source tapping regions CSTR may be determined so as to correspond to a width of the page buffer tapping regions PBTR. According to at least one example embodiment, a width of the page buffer tapping regions PBTR may be, for example, 8 times or 10 times a width of each bit line BL. A width of the common source tapping regions CSTR may be, for example, 8 times or 10 times a width of each bit line.

Figure 13:
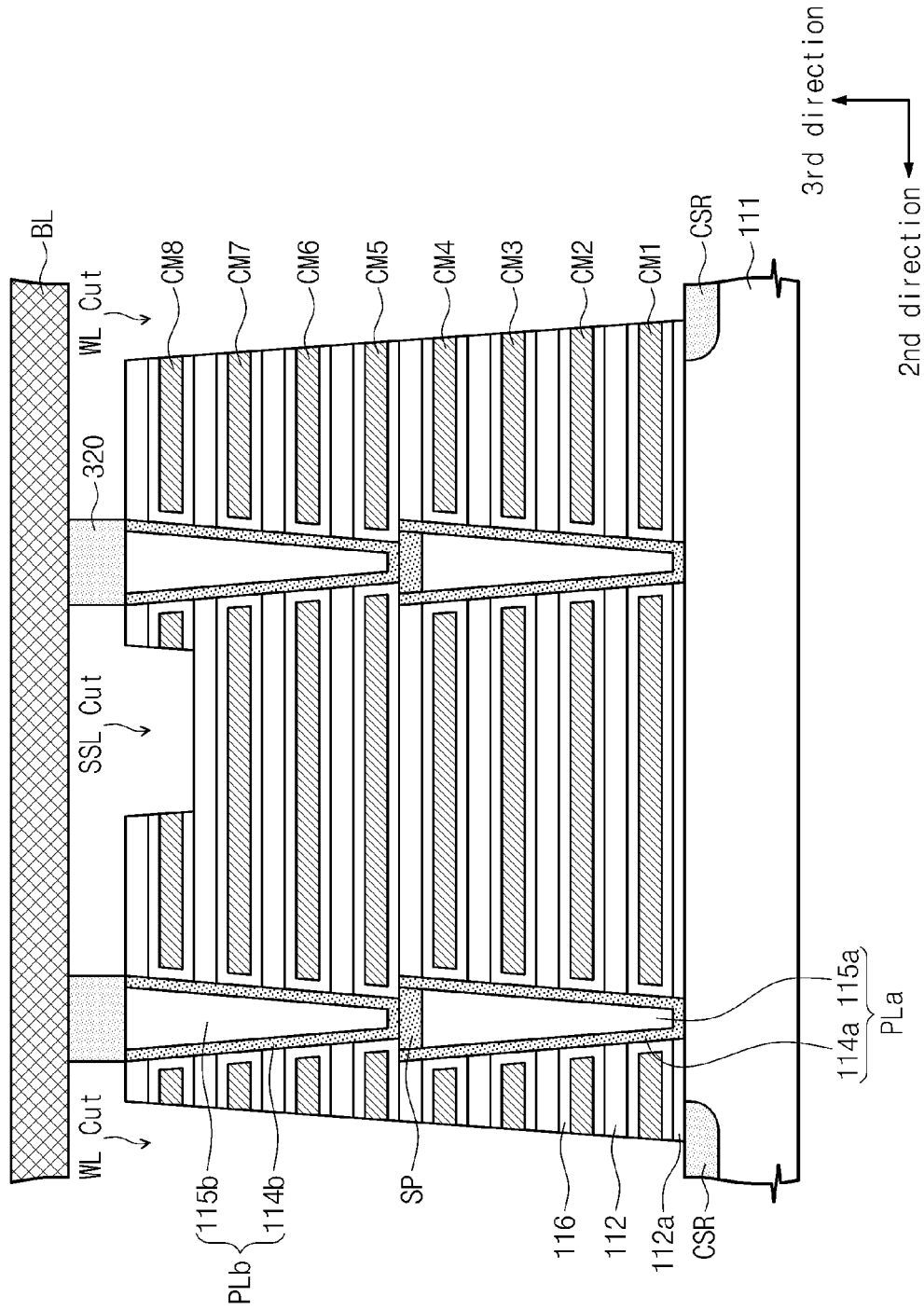

FIG. 13 is a cross-sectional view taken along a line VI-VI' in FIG. 5 according to still other example embodiments. Referring to FIGS. 5 and 13, pillars PL may include lower pillars PLa and upper pillars PLb. The lower pillars PLa may be provided on a substrate 111. The lower pillars PLa may include lower channel films 114a and lower inner materials 115a. The lower channel films 114a may include a semiconductor material of the same conductive type as the substrate 111 and/or an intrinsic semiconductor. The lower channel films 114a may act as a second-direction body. The lower inner materials 115a may include an insulation material, for example. The upper pillars PLb may be provided on the lower pillars PLa. The upper pillars PLb may include upper channel films 114b and upper inner materials 115b.

The upper channel films 114b may include a semiconductor material that may be the same conductive type as the substrate 111 and/or an intrinsic semiconductor. The upper channel films 114b may act as a second-direction body. The upper inner materials 115b may include an insulation material, for example. The lower channel films 114a and the upper channel films 114b may be interconnected to form a second-direction body. According to at least one example embodiment, semiconductor pads SP may be on the lower pillars PLa. The semiconductor pads SP may include, for example, a semiconductor material of the same conductive type as the substrate 111 and/or an intrinsic semiconductor. The lower channel films 114a and the upper channel films 114b may be coupled via the semiconductor pads SP.

According to at least one example embodiment, among conductive materials CM1-CM8 of first to eighth heights, conductive materials adjacent to the semiconductor pads SP may be dummy word lines and dummy memory cells. For example, the fourth conductive material CM4, the fifth conductive material CM5, or the fourth and fifth conductive materials CM4 and CM5 may constitute dummy word lines and dummy memory cells.

Figure 14:
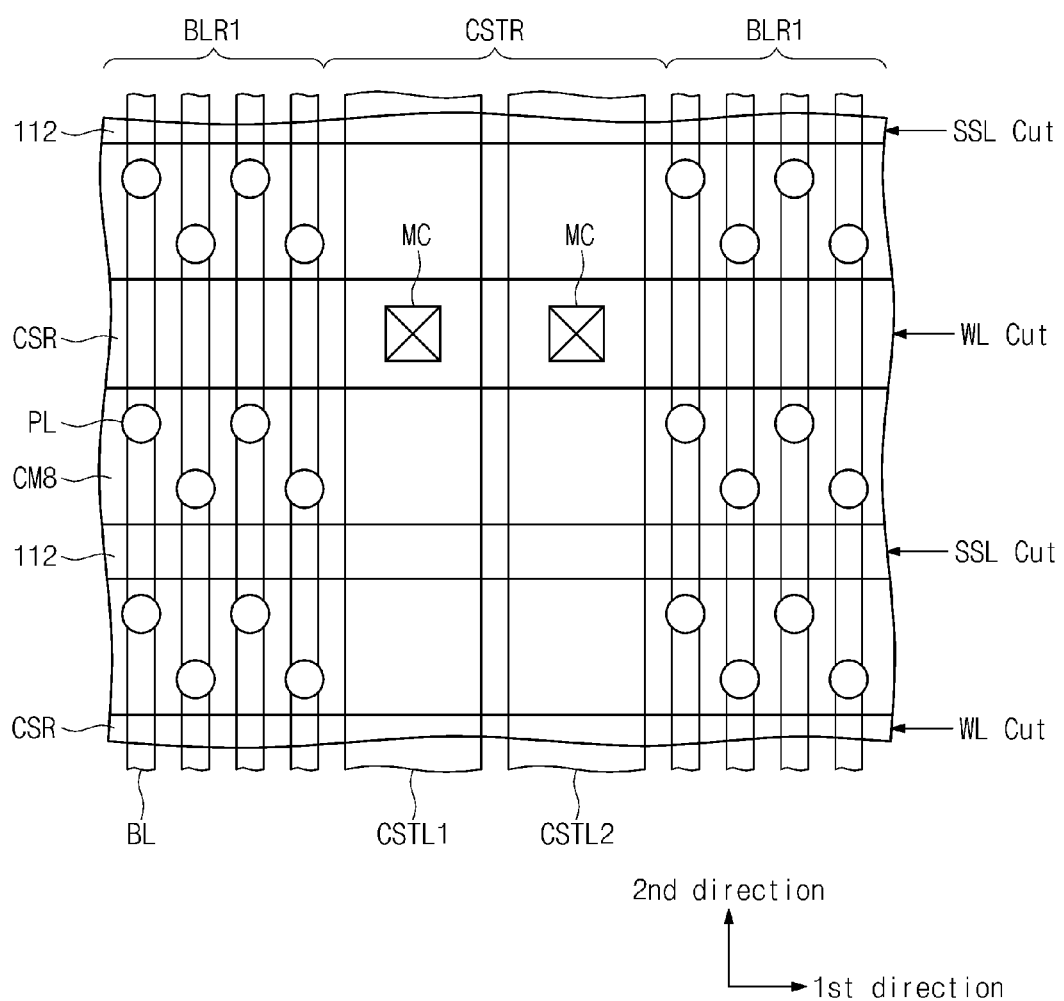
Figure 15:
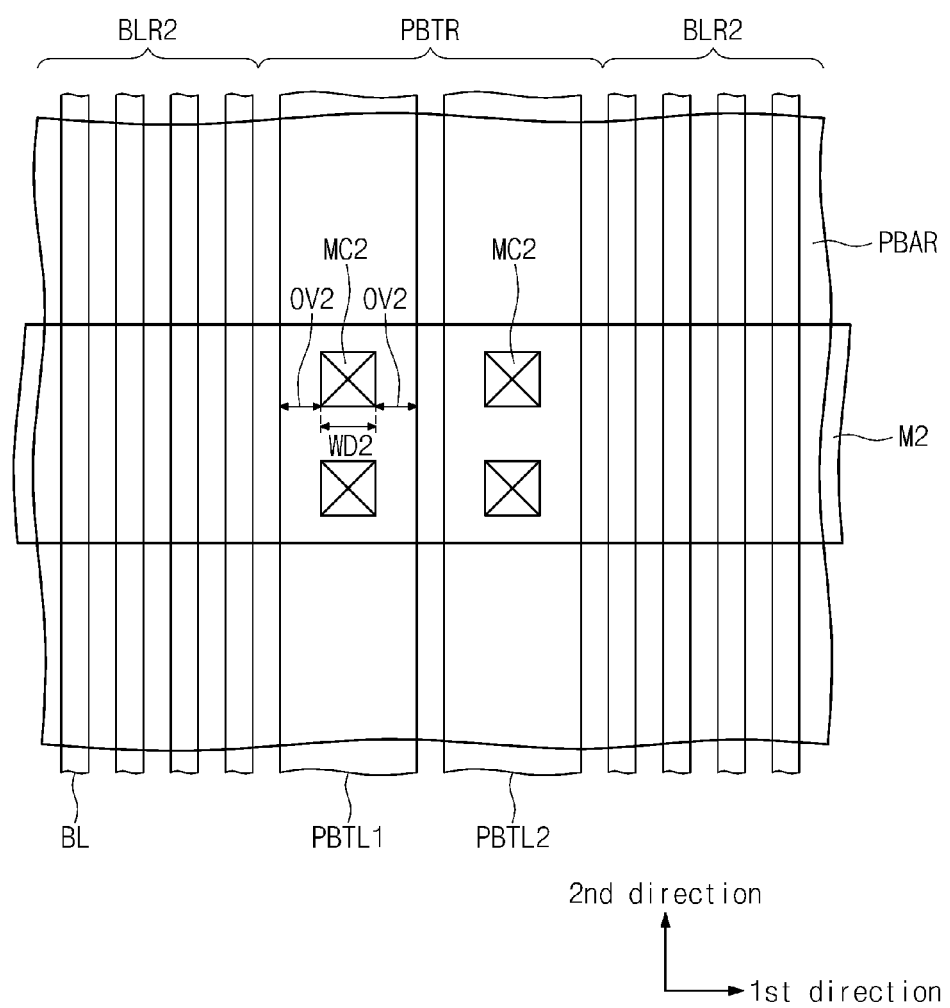

FIG. 14 is a plan view of a memory cell array of FIG. 3 according to still other example embodiments. As compared with plan views described in relation to FIGS. 4 and 5, a dummy bit line DBL may not be between common source tapping lines CSTL1 and CSTL2. The common source tapping lines CSTL1 and CSTL2 may be disposed to be closest to each other. FIG. 15 is a plan view of a page buffer of FIG. 3 according to yet still other example embodiments. As compared with plan views described with reference to FIGS. 10 and 11, a dummy bit line DBL may not be between page buffer tapping lines PBTL1 and PBTL2. The page buffer tapping lines PBTL1 and PBTL2 may be disposed to be closest to each other.

Referring to FIGS. 14 and 15, bit lines BL of second bit line regions BLR2 may extend along a second direction to be connected with bit lines BL of first bit line regions BLR1. For example, the bit lines BL extend to the second bit line regions BLR2 of FIG. 15 from first bit line regions BLR1 of FIG. 14. Widths of common source tapping regions CSTR and page buffer tapping regions PBTR may be determined in accordance with a minimum value of a width WD2 of second metal contacts MC2 and a minimum value of overlaps OV2 that may correspond to the second metal contacts MC2. Widths of the common source tapping regions CSTR and the page buffer tapping regions PBTR may be further determined by a minimum value of widths of bit lines BL and a minimum value of distances between the bit lines BL.

Figure 16:
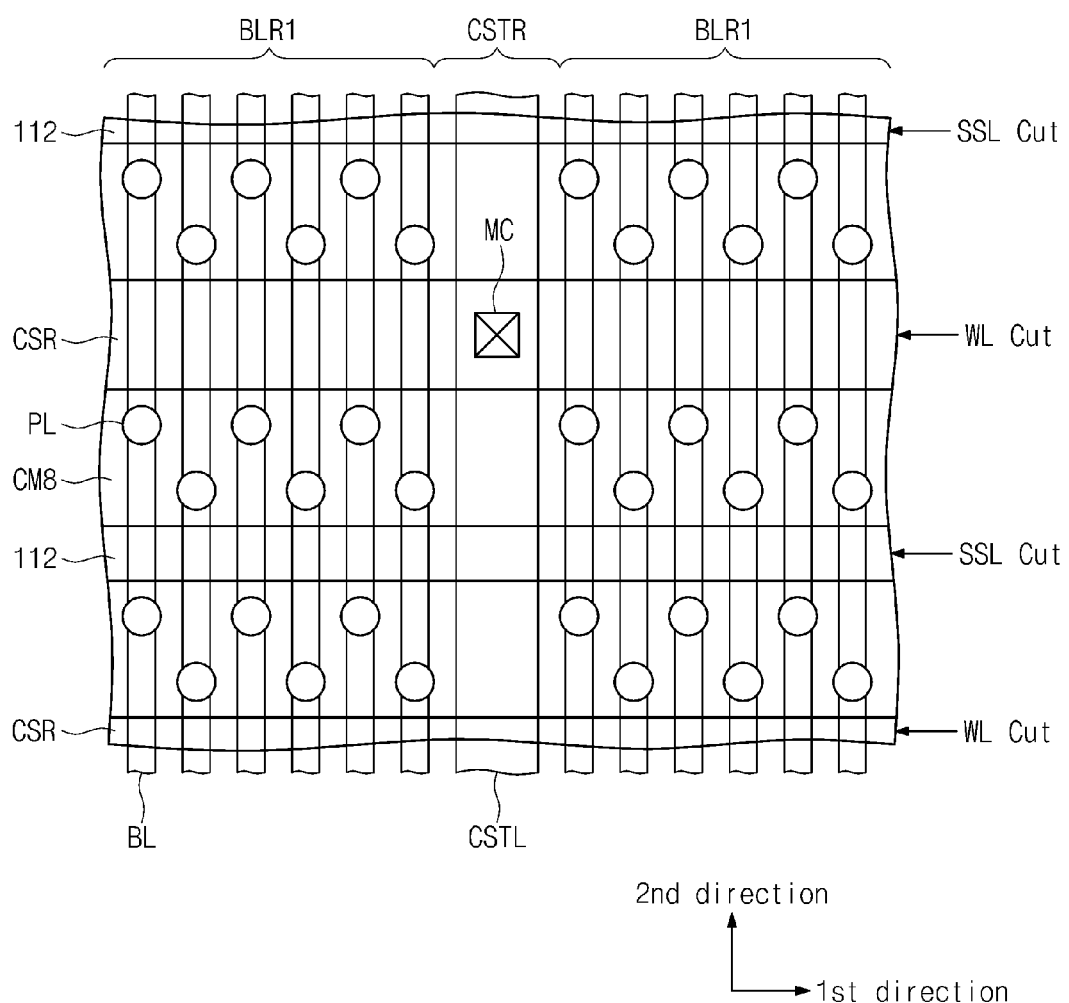

FIG. 16 is a plan view of a memory cell array of FIG. 3 according to further example embodiments. As compared with plan views described with reference to FIGS. 4 and 5, one common source tapping line may be provided at one common source tapping region. Referring to FIGS. 3 and 16, common source tapping regions CSTR and first bit line regions BLR1 may be provided alternately along a first direction. One common source tapping line may be at one common source tapping region. A plurality of common source tapping lines CSTL that may be at a plurality of common source tapping regions CSTR may supply a power supply voltage and a ground voltage along the first direction alternately. For example, a common source tapping line of a first common source tapping region may supply a power supply voltage to the common source tapping regions CSTR along the first direction. A common source tapping line of a second common source tapping region may supply a ground voltage to the common source tapping regions CSTR along the first direction. A common source tapping line of a $(2n-1)^{th}$ common source tapping region (n being an integer greater than 0) may supply a power supply voltage to the common source tapping regions CSTR along the first direction. A common source tapping line of a $2n^{th}$ common source tapping region may supply a ground voltage to the common source tapping regions CSTR along the first direction.

Figure 17:
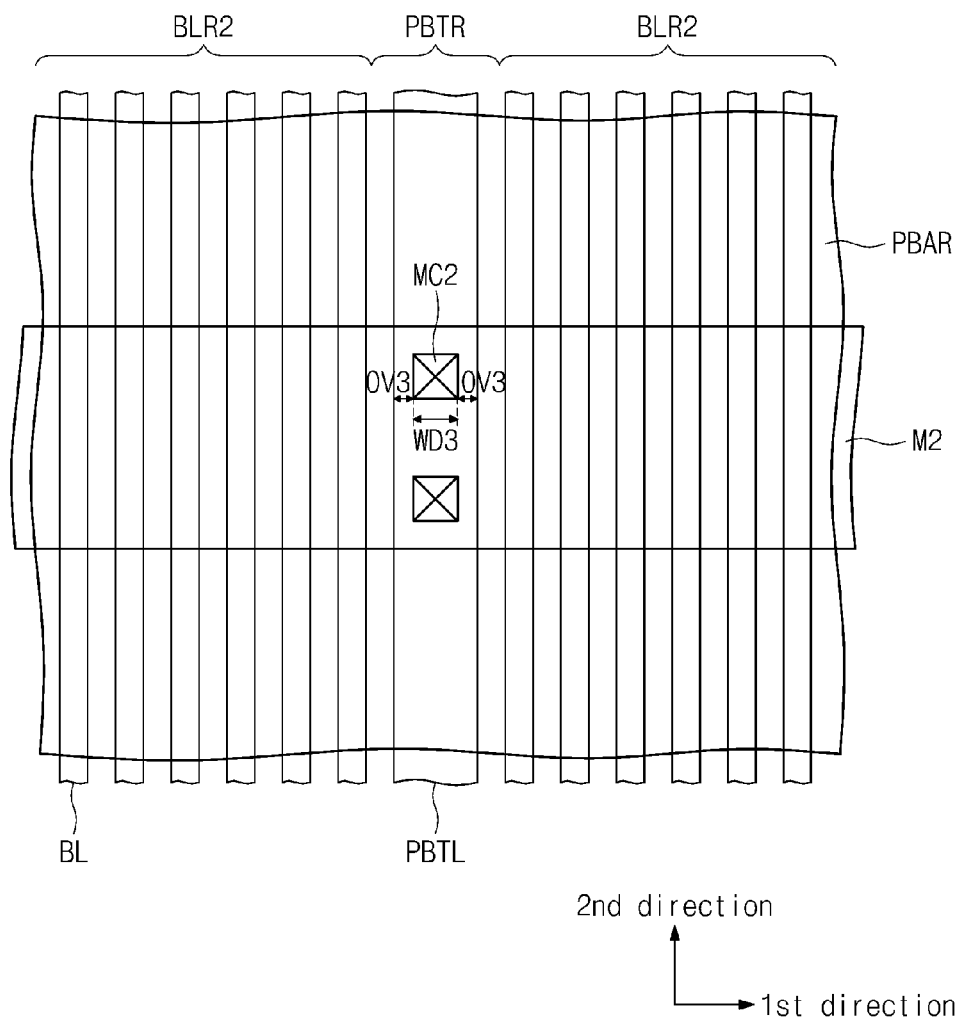

FIG. 17 is a plan view of a memory cell array of FIG. 3 according to still further example embodiments. As compared with plan views described with reference to FIGS. 10 and 11, one page buffer tapping line may be provided at one page buffer tapping region. Referring to FIGS. 3 and 17, page buffer tapping regions PBTR and second bit line regions BLR2 may be provided alternately along a first direction. One page buffer tapping line may be provided at one page buffer tapping region. A plurality of page buffer tapping lines PBTL provided at a plurality of page buffer tapping regions PBTR may supply a power supply voltage and a ground voltage along the first direction alternately. For example, a page buffer tapping line of a first page buffer tapping may supply a power supply voltage to the page buffer active region PBAR along the first direction. A page buffer tapping line of a second page buffer tapping region may supply a ground voltage to the page buffer active region PBAR along the first direction. A page buffer tapping line of a $(2n-1)^{th}$ page buffer tapping region (n being an integer greater than 0) may supply a power supply voltage to the page buffer active region PBAR along the first direction. A page buffer tapping line of a $2n^{th}$ page buffer tapping region may supply a ground voltage to the page buffer active region PBAR along the first direction.

Referring to FIGS. 16 and 17, bit lines BL of the second bit line regions BLR2 may extend along a second direction and connect with bit lines BL of first bit line regions BLR1. For example, the bit lines BL may extend to the second bit line regions BLR2 of FIG. 17 from the first bit line regions BLR1 of FIG. 16. Widths of common source tapping regions CSTR and page buffer tapping regions PBTR may be determined in accordance with a minimum value of a width WD3 of second metal contacts MC2 and a minimum value of overlaps OV3 that may correspond to the second metal contacts MC2. Widths of the common source tapping regions CSTR and the page buffer tapping regions PBTR may be further determined by a minimum value of widths of bit lines BL and a minimum value of distances between the bit lines BL.

Figure 18:
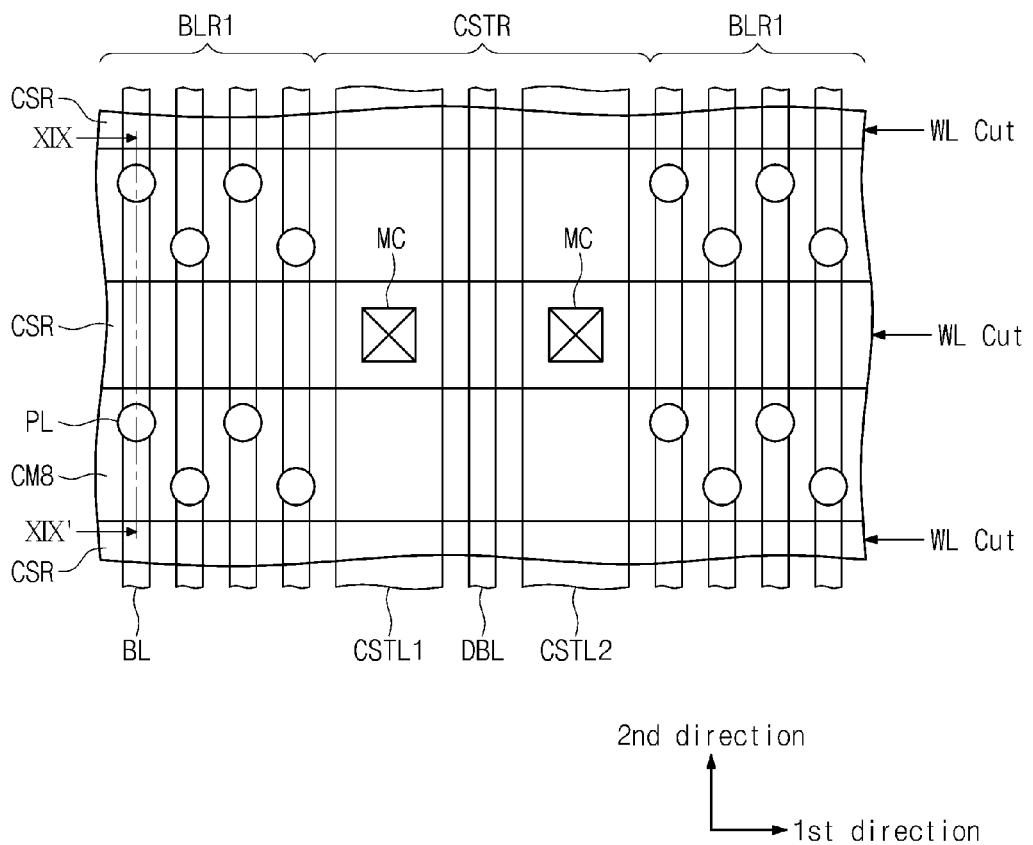
Figure 19:
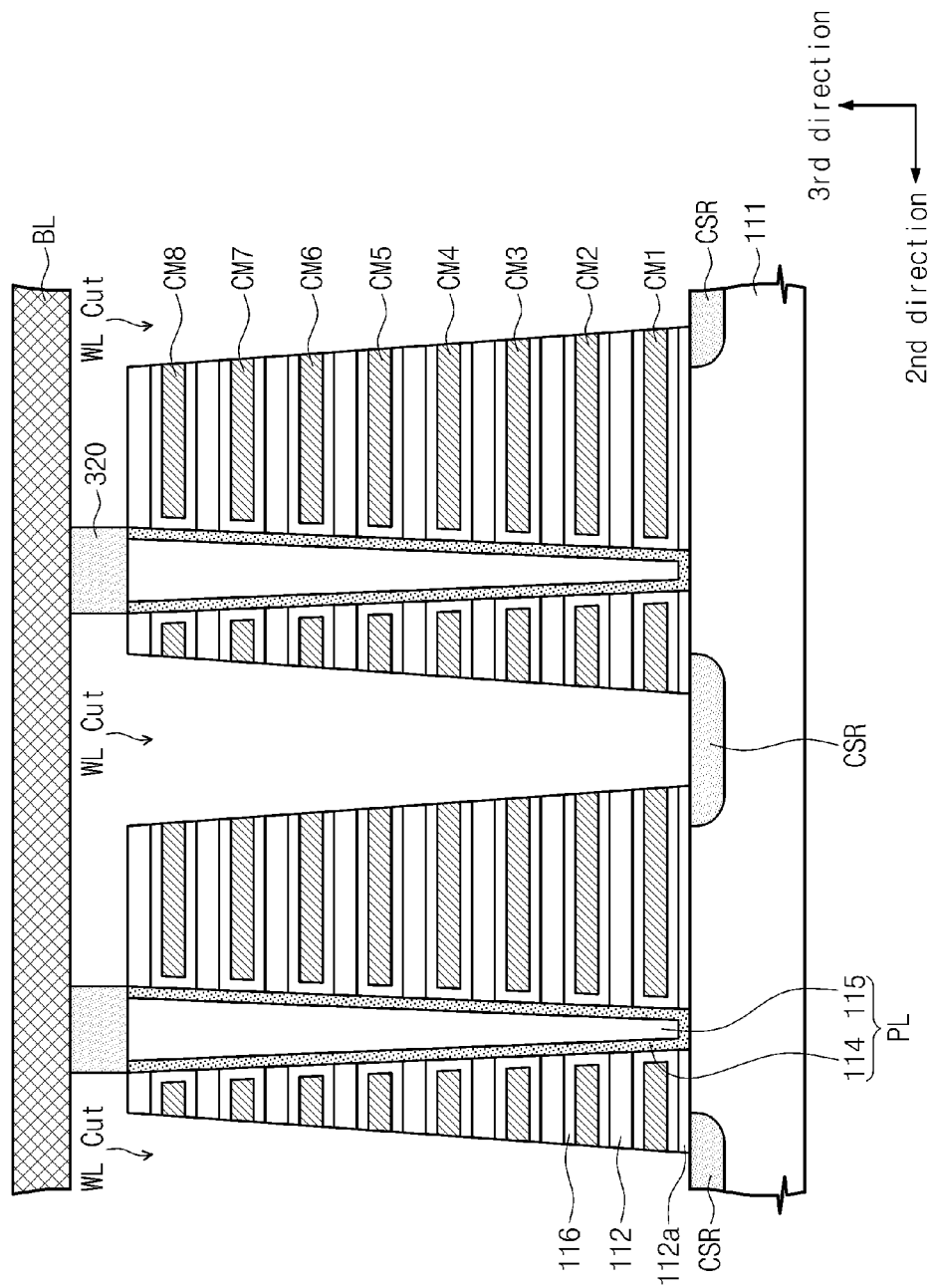

FIG. 18 is a plan view of a memory cell array of FIG. 3 according to yet further example embodiments. FIG. 19 is a cross sectional view taken along a line XIX-XIX' of FIG. 18. As compared with a memory cell array described with reference to FIGS. 5 and 6, word line cuts WL Cut may be provided instead of string selection line cuts SSL Cut. Pillars PL and word line cuts WL Cut may be provided in turn along a bit line direction. Conductive materials CM1-CM8 and insulation materials 112 and 112a may be separated by the word line cuts WL Cut. Common source regions CSR may be formed at a substrate 111 exposed by the word line cuts WL Cut.

According to at least one example embodiment, pillars may include lower pillars and upper pillars as described in relation to FIG. 13. A dummy bit line DBL may not be provided between common source tapping lines CSTL1 and CSTL2 as described in relation to FIG. 14. As described in relation to FIG. 15, a dummy bit line DBL may not be provided between page buffer tapping lines PBTL1 and PBTL2. One common source tapping line may be provided at one common source tapping region as described in relation to FIG. 16. One page buffer tapping line may be provided at one page buffer tapping region as described in relation to FIG. 17.

Figure 20:
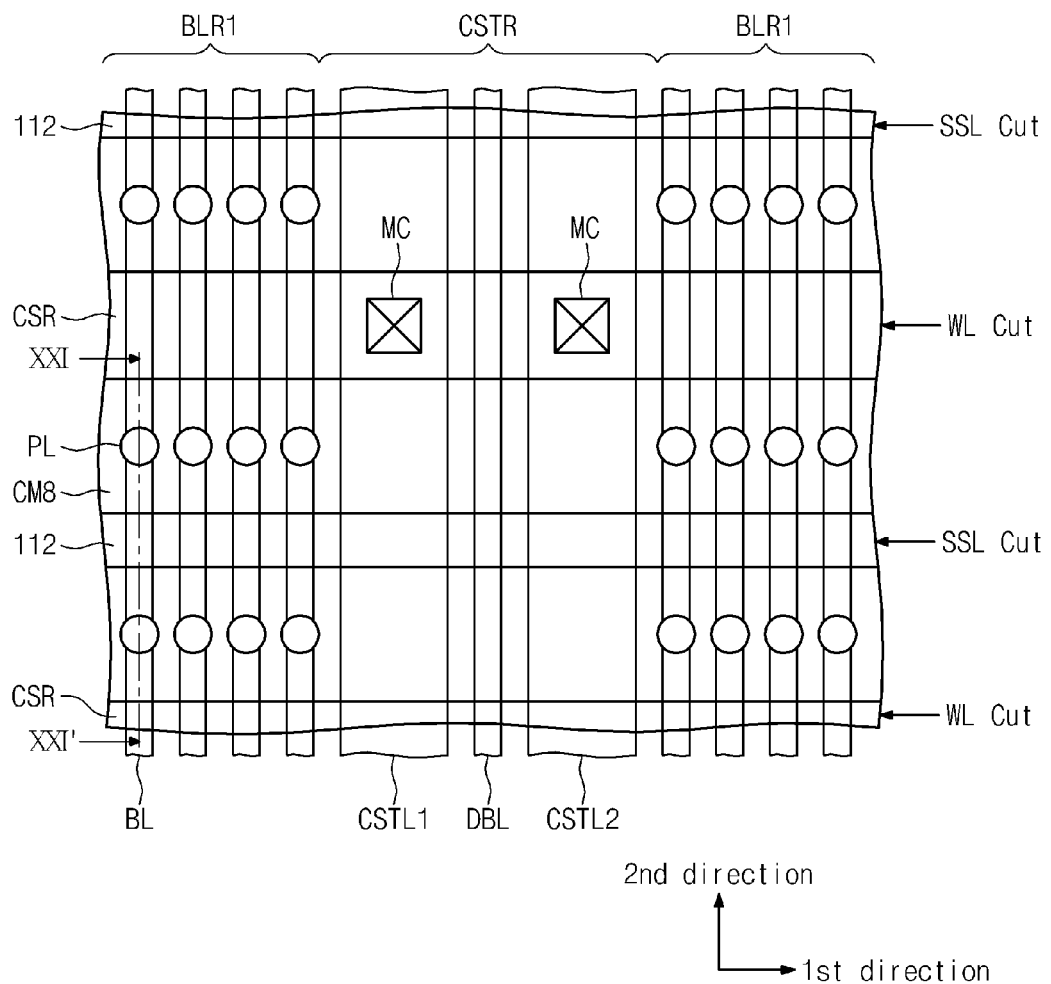
Figure 21:
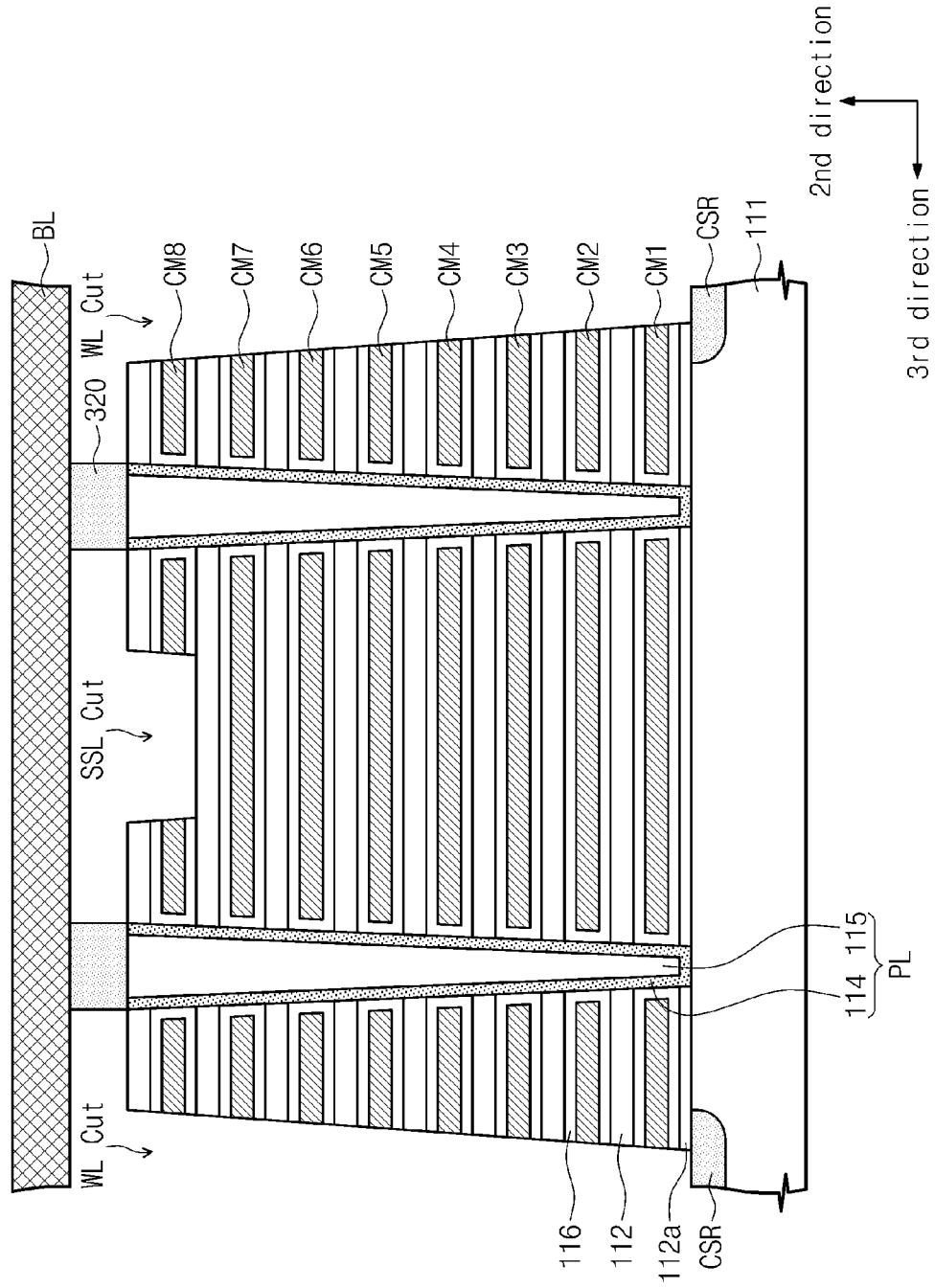

FIG. 20 is a plan view of a memory cell array of FIG. 3 according to yet still further example embodiments. FIG. 21 is a cross sectional view taken along a line XXI-XXI' of FIG. 20. As compared with a memory cell array described with reference to FIGS. 5 and 6, pillars PL connected with a conductive material CM extending along a first direction may be in a line along the first direction. According to at least one example embodiment, pillars PL may include lower pillars and upper pillars as described in relation to FIG. 13. A dummy bit line DBL may not be provided between common source tapping lines CSTL1 and CSTL2 as described in relation to FIG. 14. As described in relation to FIG. 15, a dummy bit line DBL may not be provided between page buffer tapping lines PBTL1 and PBTL2. One common source tapping line may be provided at one common source tapping region as described in relation to FIG. 16. One page buffer tapping line may be provided at one page buffer tapping region as described in relation to FIG. 17.

Figure 22:
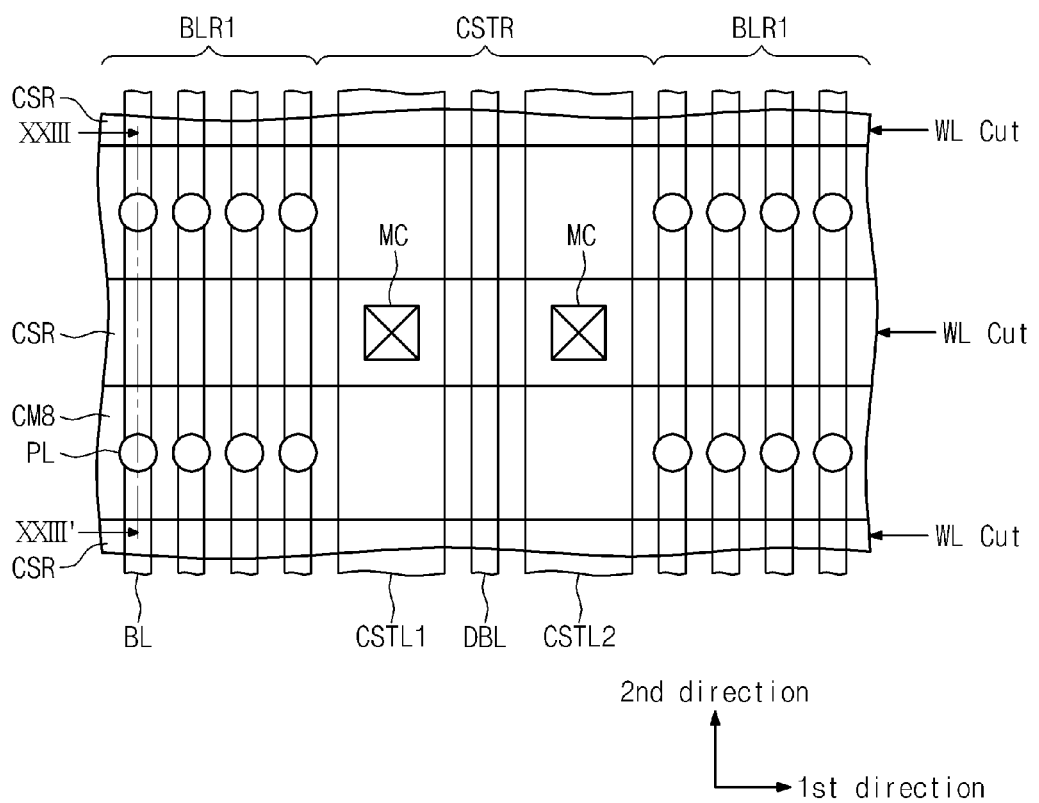
Figure 23:
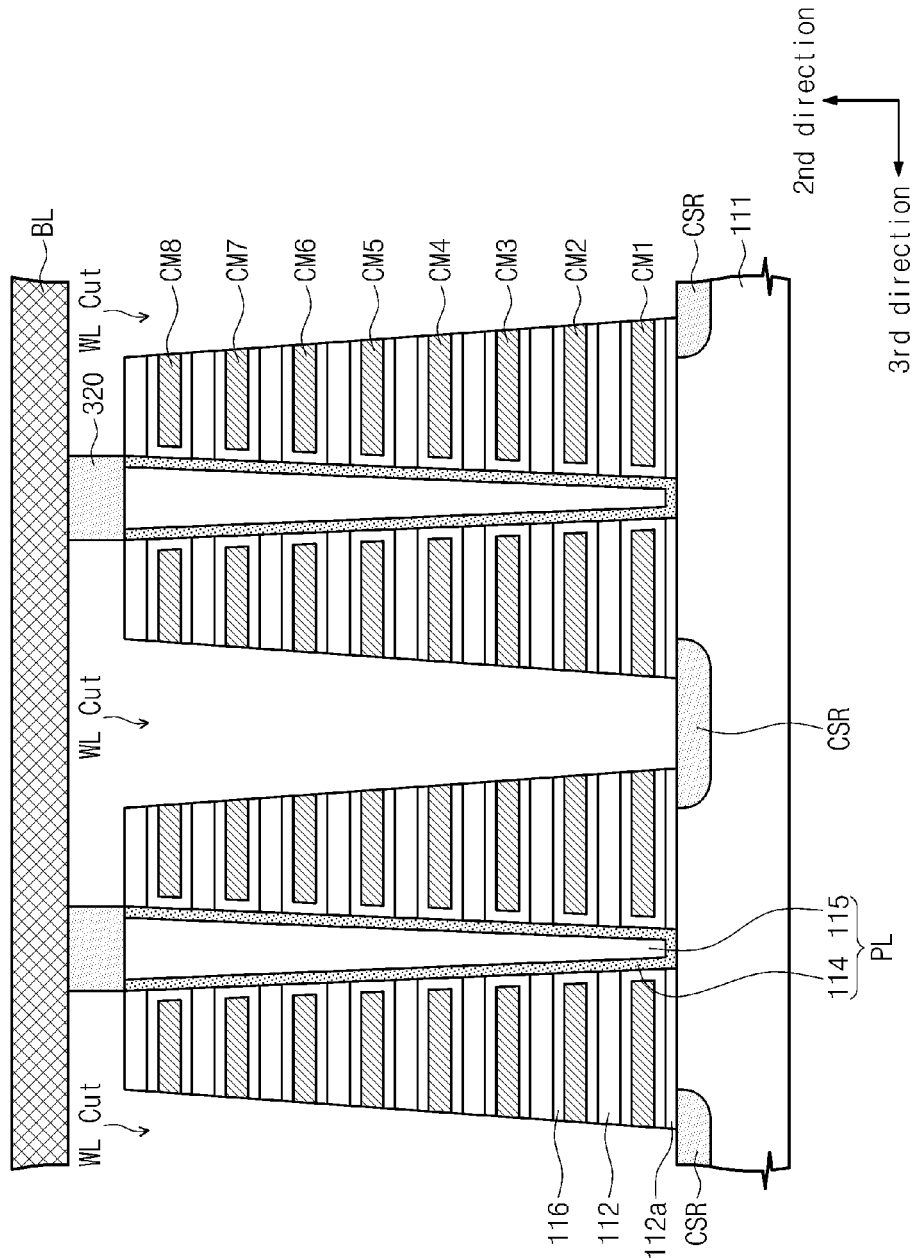

FIG. 22 is a plan view of a memory cell array of FIG. 3 according to still yet further example embodiments. FIG. 23 is a cross sectional view taken along a line XXIII-XXIII' of FIG. 22. As compared with a memory cell array described with reference to FIGS. 5 and 6, pillars PL that may be connected with a conductive material CM extending along a first direction may be in a line along the first direction. Word line cuts WL Cut may be provided instead of string selection line cuts SSL Cut. Pillars PL and word line cuts WL Cut may be provided in turn along a bit line direction. Conductive materials CM1-CM8 and insulation materials 112 and 112a may be separated by the word line cuts WL Cut. Common source regions CSR may be at a substrate 111 exposed by the word line cuts WL Cut.

According to at least one example embodiment, pillars PL may include of lower pillars and upper pillars as described in relation to FIG. 13. A dummy bit line DBL may not be provided between common source tapping lines CSTL1 and CSTL2 as described in relation to FIG. 14. As described in relation to FIG. 15, a dummy bit line DBL may not be provided between page buffer tapping lines PBTL1 and PBTL2. One common source tapping line may be provided at one common source tapping region as described in relation to FIG. 16. One page buffer tapping line may be provided at one page buffer tapping region as described in relation to FIG. 17.

Figure 24:
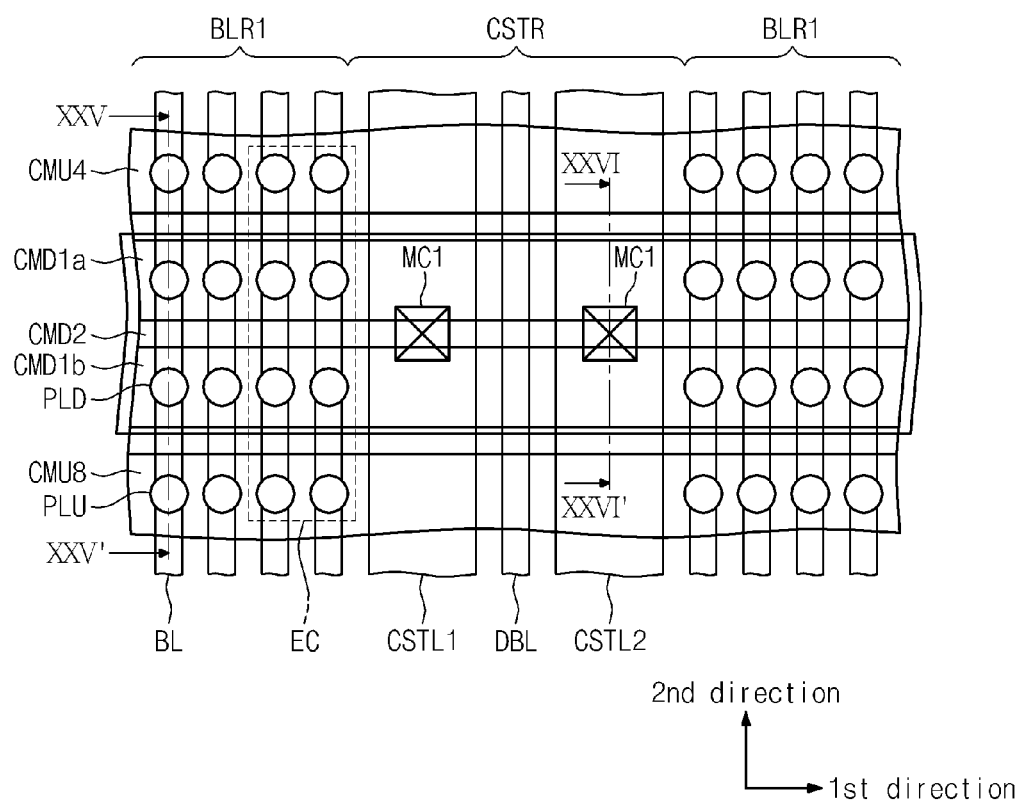
Figure 25:
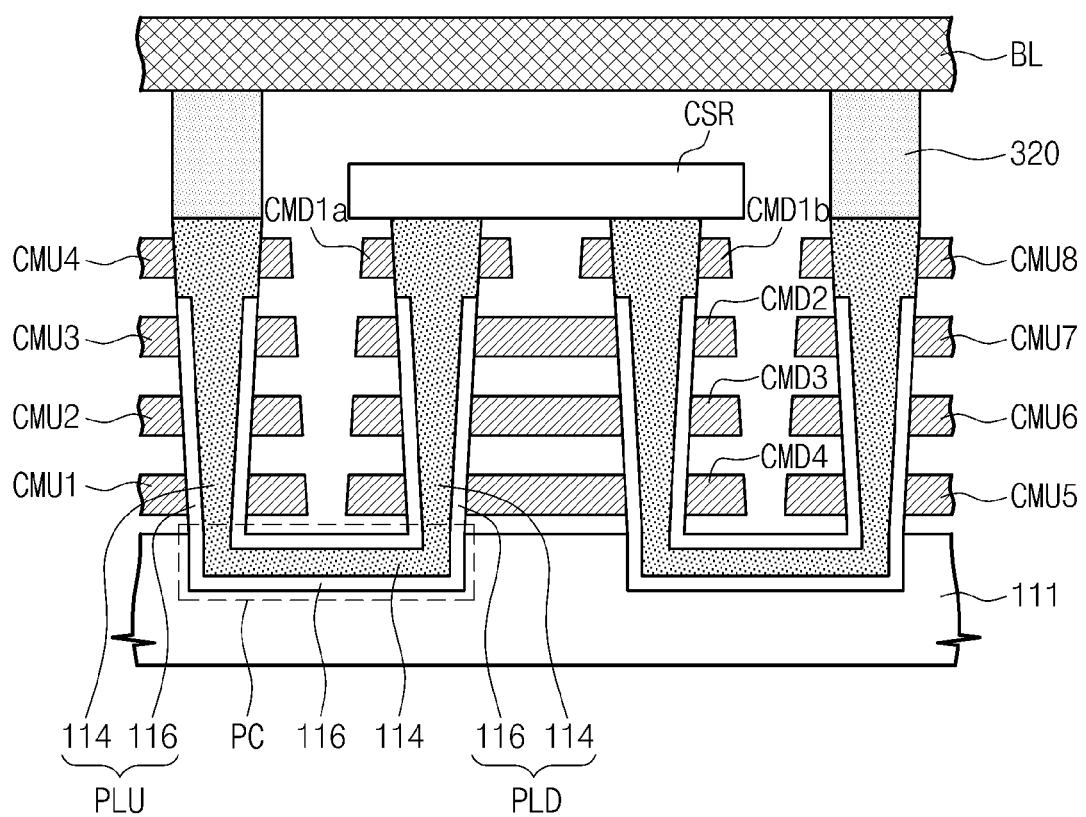
Figure 26:
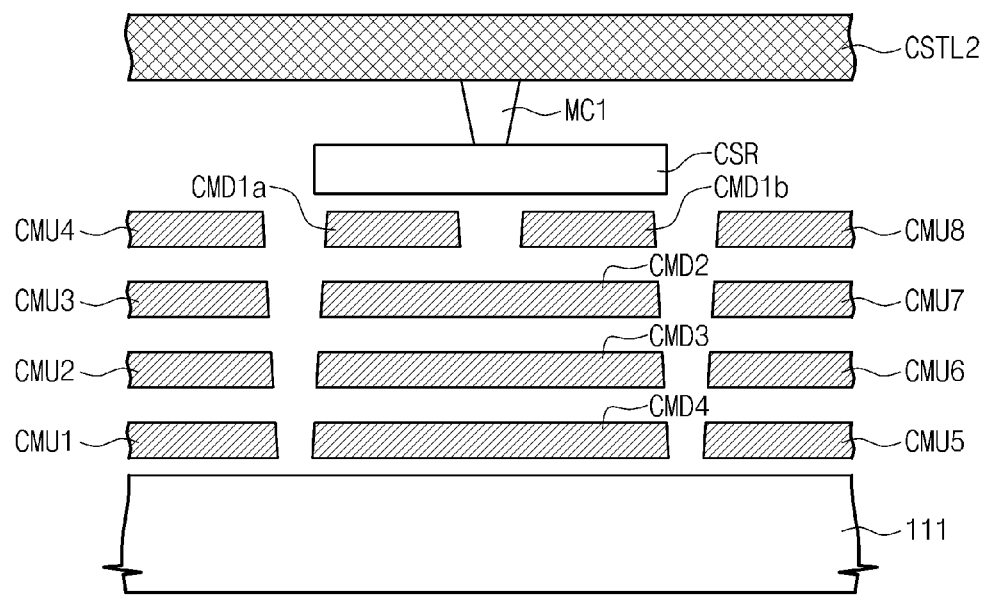

FIG. 24 is a plan view illustrating a memory cell array of FIG. 3 according to still yet other example embodiments. FIG. 25 is a perspective view taken along a line XXV-XXV' of FIG. 24. FIG. 26 is a cross-sectional view taken along a line XXVI-XXVI' of FIG. 24. Referring to FIGS. 24-26, first to eighth upper conductive materials CMU1-CMU8 extending along the first direction may be provided on a substrate 111. The first to fourth upper conductive materials CMU1-CMU4 may be stacked in a direction perpendicular to the substrate 111 and spaced apart from one another in a direction perpendicular to the substrate 111. The fifth to eighth upper conductive materials CMU5-CMU8 may be stacked in a direction perpendicular to the substrate 111 and spaced apart from one another in a direction perpendicular to the substrate 111. The first to fourth upper conductive materials CMU1-CMU4 may be spaced apart from the fifth to eighth upper conductive materials CMU5-CMU8 along the second direction.

Lower conductive materials CMD1a, CMD1b, and CMD2-CMD4 extending along the first direction may be between the first to fourth upper conductive materials CMU1-CMU4 and the fifth to eighth upper conductive materials CMU5-CMU8. The lower conductive materials CMD2-CMD4 may be stacked in a direction perpendicular to the substrate 111 and spaced apart from one another in a direction perpendicular to the substrate 111. The lower conductive materials CMD1a and CMD1b may be on the lower conductive material CMD2. The lower conductive materials CMD1a and CMD extending along the first direction may be spaced apart along the second direction.

At first bit line regions BLR1 and the first to fourth upper conductive materials CMU1-CMU4, a plurality of upper pillars PLU may be configured to penetrate the first to fourth upper conductive materials CMU1-CMU4 in a direction perpendicular to the substrate 111 so as to contact with the substrate 111. The plurality of upper pillars PLU may be spaced apart along the first direction. At the first bit line regions BLR1 and the fifth to eighth upper conductive materials CMU5-CMU8, a plurality of upper pillars PLU may be configured to penetrate the fifth to eighth upper conductive materials CMU5-CMU8 in a direction perpendicular to the substrate 111 so that it may contact with the substrate 111. The plurality of upper pillars PLU may be spaced apart along the first direction.

Each of the upper pillars PLU may include an information storage film 116 and a channel film 114. The information storage film 116 may store information by trapping and/or discharging charges. The information storage film 116 may include a tunneling insulation film, a charge trap film and/or a blocking insulation film. The channel films 114 may act as vertical bodies of the upper pillars PLU. The channel films 114 may include an intrinsic semiconductor, respectively. The channel films 114 may include semiconductor of the same conductivity type (e.g., p-type) as the substrate 111.

A plurality of lower pillars PLD may be formed in the first bit line regions BLR1 and the lower conductive materials CMD1a. The plurality of lower pillars PLD may be spaced apart along the first direction and may penetrate the lower conductive materials CMD2-CMD4 and the lower conductive material CMD1a in a direction perpendicular to the substrate 111 so that it may contact with the substrate 111. A plurality of lower pillars PLD may be in the first bit line regions BLR1 and the lower conductive materials CMD1a. The plurality of lower pillars PLD may be spaced apart along the first direction and may penetrate the lower conductive materials CMD2-MD4 and the lower conductive material CMD1b in a direction perpendicular to the substrate 111 so that it may contact with the substrate 111.

Each of the lower pillars PLD may include an information storage film 116 and a channel film 114. The information storage film 116 may store information by trapping and/or discharging charges. The information storage film 116 may include a tunneling insulation film, a charge trap film and a blocking insulation film. The channel films 114 may act as vertical bodies of the lower pillars PLD. The channel films 114 may include, for example, an intrinsic semiconductor. The channel films 114 may include a semiconductor of the same conductivity type (e.g., p-type) as the substrate 111.

In the first bit line regions BLR1, a plurality of pipeline contacts PC may be provided at the substrate 111. The pipeline contacts PC may extend in a bit line direction so that it may connect lower surfaces of upper pillars PLU that may be formed at the first upper conductive material CMU1 with lower surfaces of lower pillars PLD that may be formed at the lower conductive material CMD1a. The pipeline contacts PC may extend in a bit line direction so that it may connect lower surfaces of upper pillars PLU that may be formed on the fifth to eighth upper conductive materials CMU5-CMU8 with lower surfaces of lower pillars PLD that may be formed at the lower conductive material CMD1b.

According to at least one example embodiment, each of the pipeline contacts PC may include a channel film 114 and an information storage film 116. The channel films 114 of the pipeline contacts PC may interconnect the channel films 114 of the upper pillars PLU and channel films of the lower pillars PLD. The information storage films 116 of the pipeline contacts PC may interconnect the information storage films 116 of the upper pillars PLU and the information storage films 116 of the lower pillars PLD.

Common source regions CSR extending along the first direction may be on the lower pillars PLD. The common source region CSR may extend along the first direction so that it may be connected with the plurality of lower pillars PLD. The common source region CSR may form a common source line CSL. The common source region CSR may include, for example, a metallic material. Drains 320 may be provided on the upper pillars PLU. The drains 320 may include a semiconductor material that may be of a conductivity type (e.g., n-type) different from the substrate 111. In the first bit line regions BLR1, bit lines BL may be formed on the drains 320. The bit lines BL may be spaced apart along the first direction. The bit lines BL may extend along the second direction so as to be connected with the drains 320.

According to at least one example embodiment, the bit lines BL and the drains 320 may be connected via contact plugs, and the common source region CSR and the lower pillars PLD may be connected via contact plugs. Common source tapping lines CSTL1 and CSTL2 and a dummy bit line DBL may be provided at common source tapping regions CSTR. The common source tapping lines CSTL1 and CSTL2 may be spaced apart along the first direction and extend along the second direction. Common source regions CSR may be connected with common source tapping lines CSTL1 and CSTL2 via a plurality of metal contacts MC1. The common source tapping lines CSTL1 and CSTL2 may supply a power to the common source regions CSR.

An equivalent circuit EC of a memory cell array 110 may have a structure illustrated in FIG. 9. When the memory cell array 110 is of a structure described with reference to FIGS. 24-26, a page buffer 130 may be of a structure described with reference to FIGS. 10-12. According to at least one example embodiment, pillars may include lower pillars and upper pillars as described in relation to FIG. 13. A dummy bit line DBL may not be between common source tapping lines CSTL1 and CSTL2 as described in relation to FIG. 14. As described in relation to FIG. 15, a dummy bit line DBL may not be provided between page buffer tapping lines PBTL1 and PBTL2. One common source tapping line may be provided at one common source tapping region as described in relation to FIG. 16. One page buffer tapping line may be provided at one page buffer tapping region as described in relation to FIG. 17.

Figure 27:
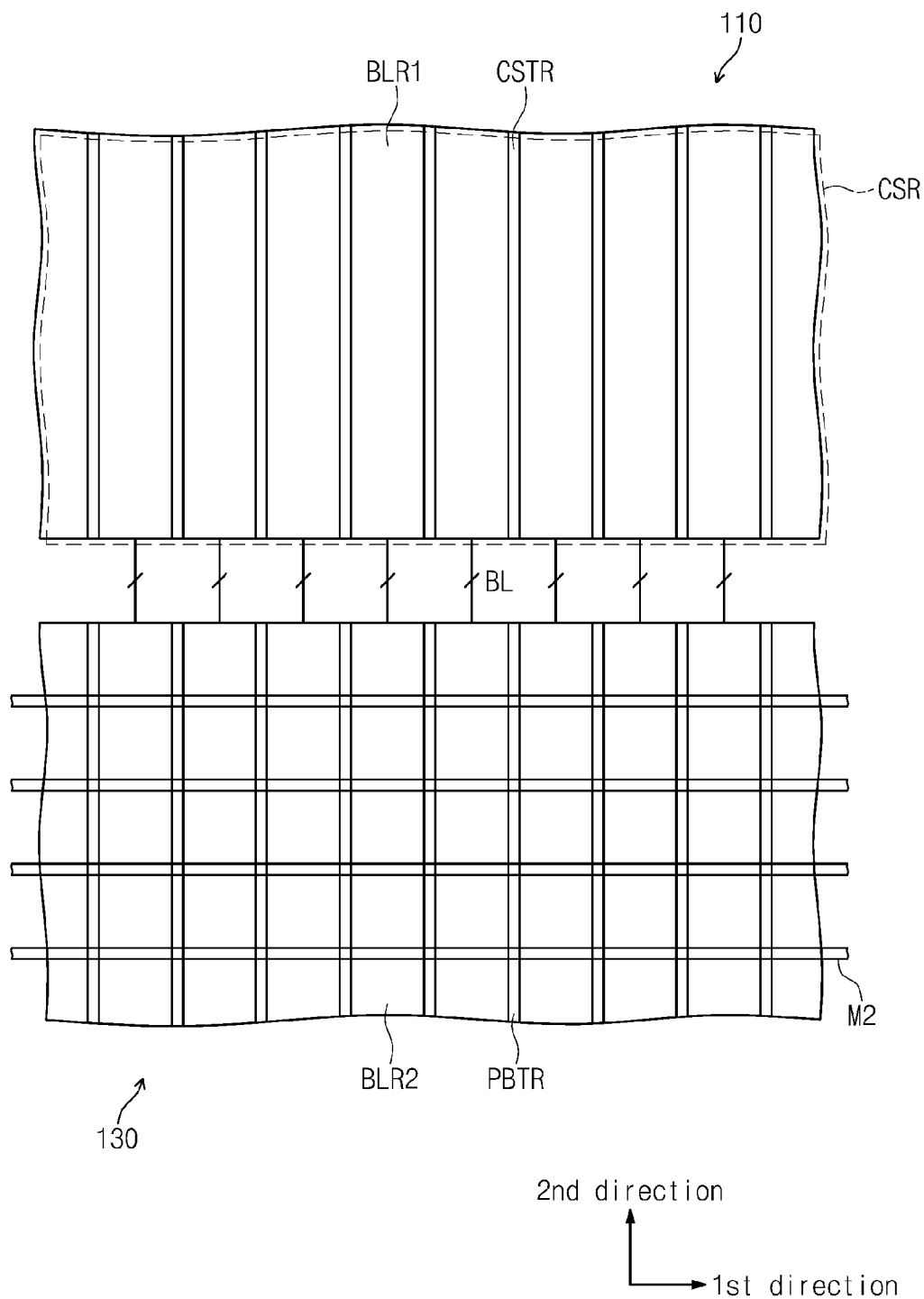

FIG. 27 is a plan view illustrating a memory cell array and page buffer of FIGS. 1 and 2 according to even further example embodiments. As compared with a plan view described with reference to FIG. 3, one common source region CSR may be provided to a memory cell array 110. The common source region CSR may be a common source line CSL.

Figure 28:
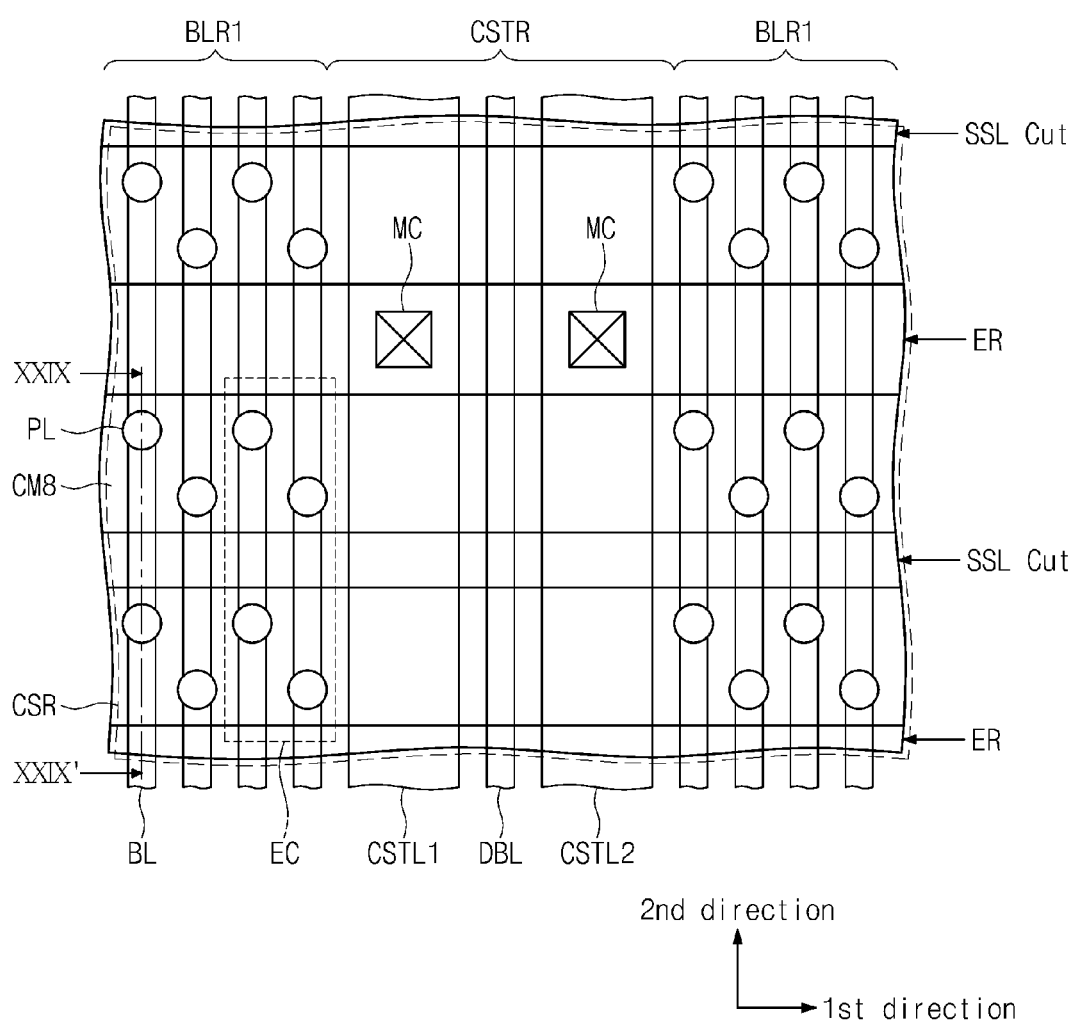
Figure 29:
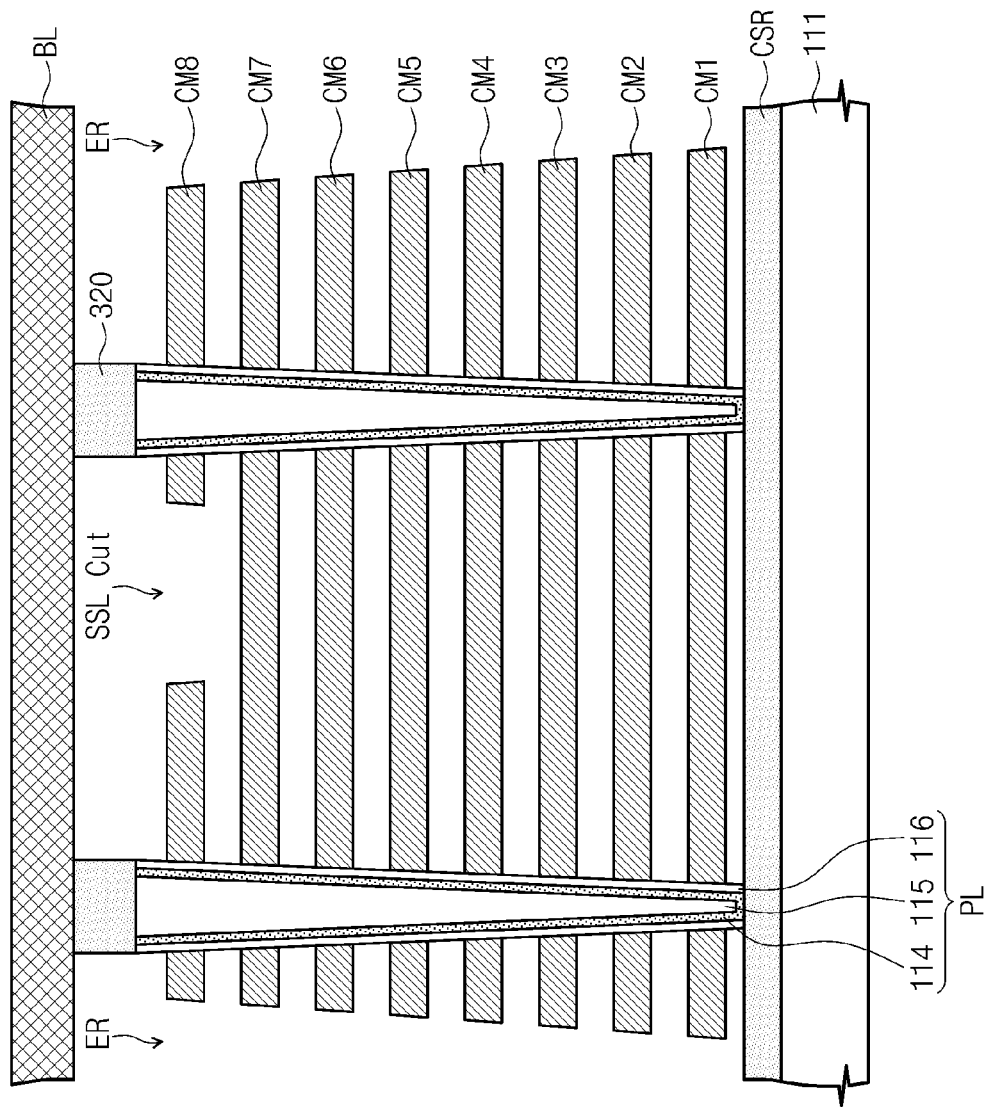

FIG. 28 is a plan view illustrating a memory cell array of FIG. 27 according to at least one example embodiment. FIG. 29 is a cross-sectional view taken along a line XXIX-XXIX' of FIG. 28. Referring to FIGS. 28 and 29, a common source region CSR may be formed at a substrate 111. In an example embodiment, the common source region CSR may be a doping region. The common source region CSR may be a common source line CSL.

First to eighth conductive materials CM1-CM8 may be formed at the common source region CSR. The first to eighth conductive materials CM1-CM8 may be stacked in a direction perpendicular to the substrate 111 and spaced apart in a direction perpendicular to the substrate 111. The first to eighth conductive materials CM1-CM8 may be of a plate shape extending along first and second directions. A plurality of pillars PL may be provided to penetrate the first to eighth conductive materials CM1-CM8 in a direction perpendicular to the substrate 111 so as to contact with the common source region CSR. The pillars PL may include information storage films 116, channel films 114 and inner materials 115.

The information storage films 116 may store information by trapping or discharging charges. The information storage films 116 may include a tunneling insulation film, a charge trapping film and a blocking insulation film. The channel films 114 may act as a vertical body of the pillars PL. The channel films 114 may include, for example, an intrinsic semiconductor. The channel films 114 may include a semiconductor of the same conductive type (e.g., p-type) as the substrate 111. The inner materials 115 may include an insulation material and/or air gap.

In conductive materials that may be separated by exposure regions ER, string selection line cuts SSL Cut may be provided. The string selection line cuts SSL Cut may divide conductive material, used as string selection lines SSL, among the first to eighth conductive materials CM1-CM8. For example, when the eighth conductive materials CM8 are used as string selection lines SSL, the string selection line cuts SSL Cut may partition the eighth conductive materials CM8.

The string selection line cuts SSL Cut and pillars PL may be provided in turn along the second direction. The string selection line cuts SSL Cut may be between the pillars PL in a bit line direction. According to at least one example embodiment, in FIGS. 28 and 29, in each of the first to eighth conductive materials CM1-CM8 partitioned by the exposure regions ER, two columns of pillars may be provided in a bit line direction, and string selection line cuts SSL Cut may be formed between two columns of pillars. In each of the first to eighth conductive materials CM1-CM8 partitioned by the exposure regions ER, m columns (m being an integer more than 1) of pillars may be provided in a bit line direction, and string selection line cuts SSL Cut may be formed between m columns of pillars.

An equivalent circuit EC of a memory cell array 110 may be of a structure illustrated in FIG. 9. When the memory cell array 110 is of a structure described with reference to FIGS.

28 to 29, a page buffer 130 may be of a structure described with reference to FIGS. 10-12.

According to at least one example embodiment, pillars may be formed of lower pillars and upper pillars as described in relation to FIG. 13. A dummy bit line DBL may not be provided between common source tapping lines CSTL1 and CSTL2 as described in relation to FIG. 14. As described in relation to FIG. 15, a dummy bit line DBL may not be provided between page buffer tapping lines PBTL1 and PBTL2. One common source tapping line may be provided at one common source tapping region as described in relation to FIG. 16. One page buffer tapping line may be provided at one page buffer tapping region as described in relation to FIG. 17.

Figure 30:
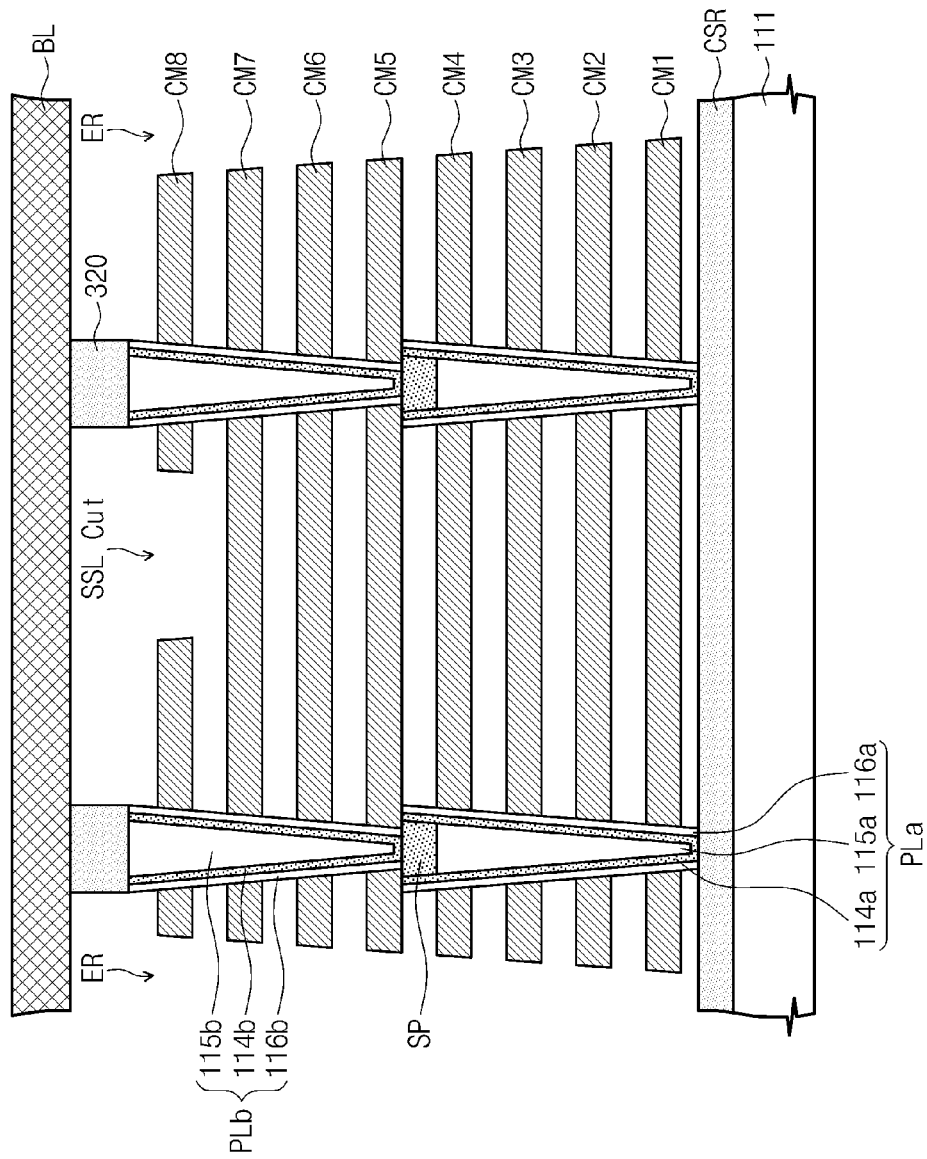

FIG. 30 is a cross-sectional view taken along a line XXIX-XXIX' in FIG. 28 according to at least one example embodiment. As compared with a cross section view described in relation to FIGS. 28 and 29, pillars PL may include lower pillars PLa and upper pillars PLb. The lower pillars PLa may be on a substrate 111. The lower pillars PLa may include lower information storage films 116a, lower channel films 114a and lower inner materials 115a. The lower channel films 114a may include a semiconductor material that may be of the same conductive type as the substrate 111 and/or an intrinsic semiconductor. The lower channel films 114a may act as a second-direction body. The lower inner materials 115a may include an insulation material.

The upper pillars PLb may be provided on the lower pillars PLa. The upper pillars PLb may include upper information storage films 116b, upper channel films 114b, and upper inner materials 115b. The upper channel films 114b may include a semiconductor material of the same conductive type as the substrate 111 and/or an intrinsic semiconductor. The upper channel films 114b may act as a vertical body of conductive materials CM5-CM8. The upper inner materials 115b may include an insulation material.

The lower channel films 114a and the upper channel films 114b may be interconnected to form a second-direction body. According to at least one example embodiment, semiconductor pads SP may be provided on the lower pillars PLa. The semiconductor pads SP may include a semiconductor material that may be of the same conductive type as the substrate 111 and/or an intrinsic semiconductor. The lower channel films 114a and the upper channel films 114b may be coupled via the semiconductor pads SP.

According to at least one example embodiment, among conductive materials CM1-CM8 of first to eighth heights, conductive materials adjacent to the semiconductor pads SP may constitute dummy word lines and dummy memory cells. For example, the fourth conductive material CM4, the fifth conductive material CM5, or the fourth and fifth conductive materials CM4 and CM5 may constitute dummy word lines and dummy memory cells.

Figure 31:
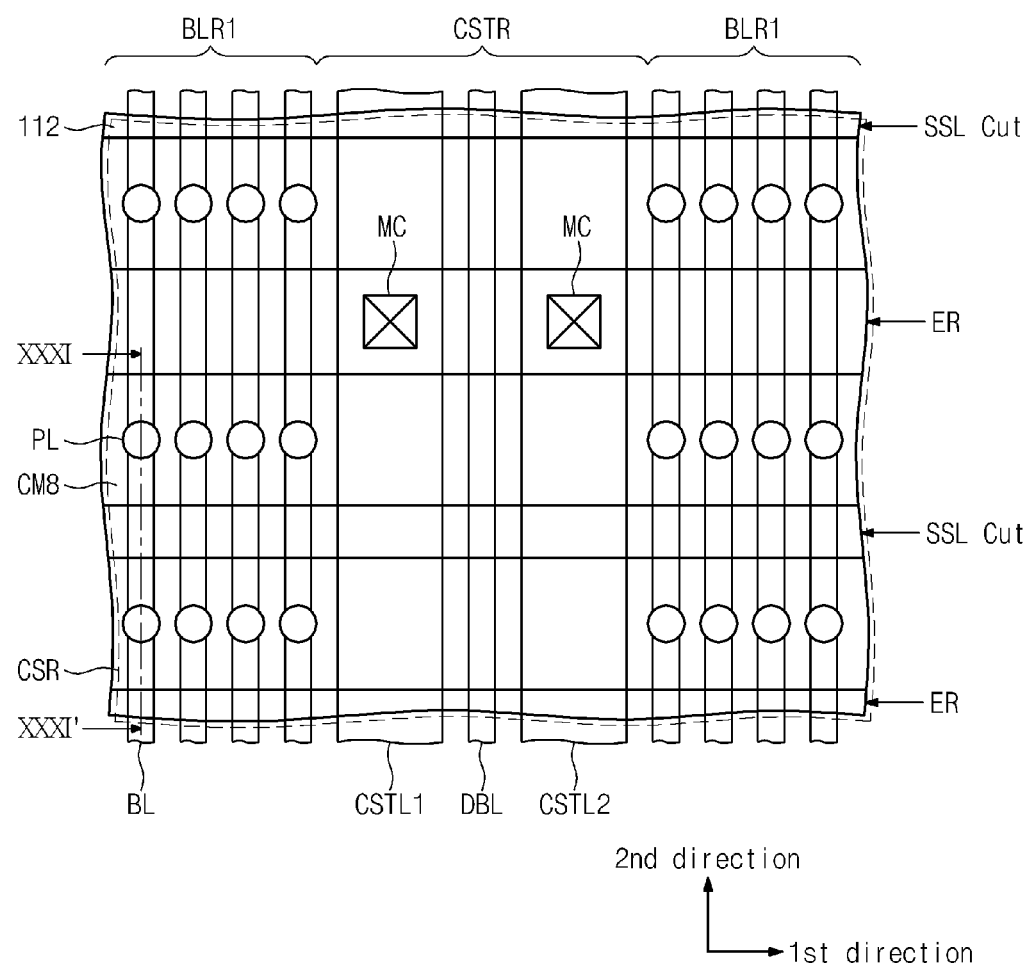
Figure 32:
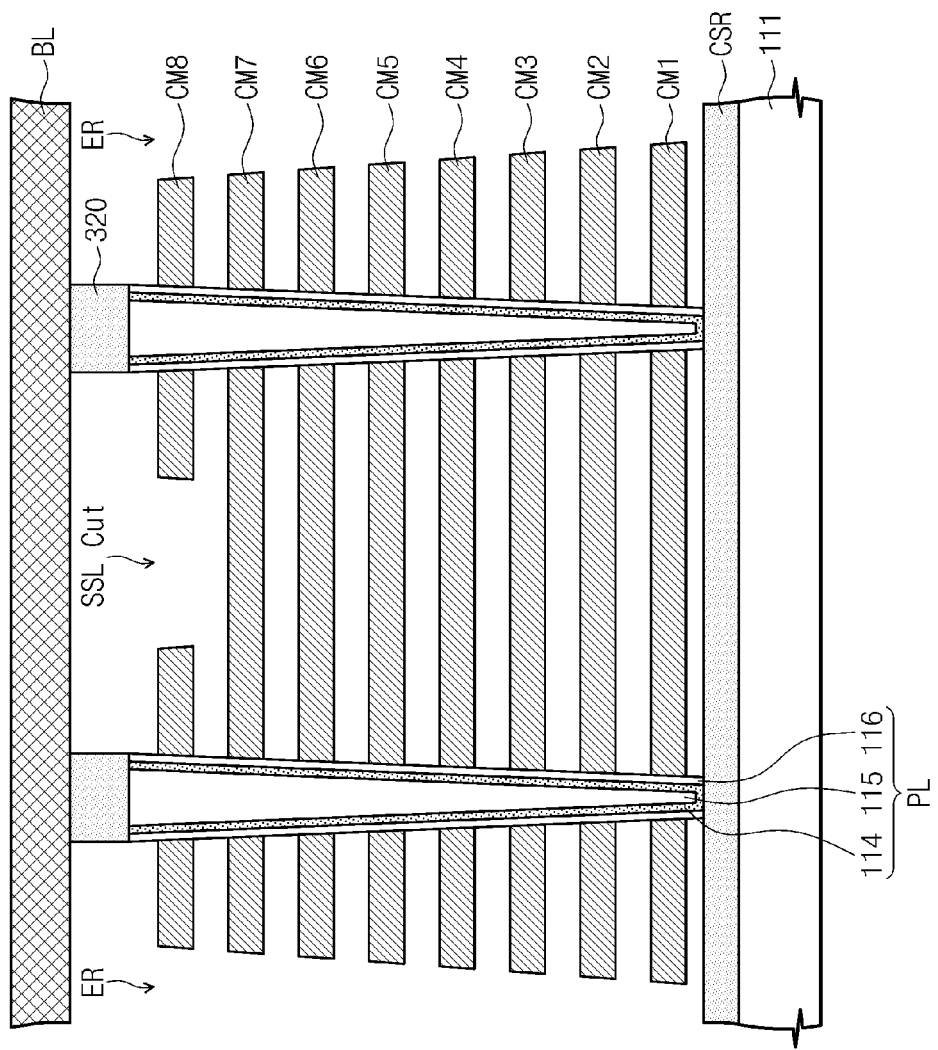

FIG. 31 is a plan view illustrating a memory cell array in FIG. 27 according to even other example embodiment. FIG. 32 is a cross-sectional view taken along a line XXXII-XXXII' of FIG. 31. As compared with a memory cell array 110 described in relation to FIGS. 28 and 29, pillars PL that may be provided between closest string selection line cuts SSL Cut and between a word line cut and a string selection line cut disposed to be closest to each other may be in a line along a first direction. When the memory cell array 110 is a structure described with reference to FIGS. 31 and 32, a page buffer 130 may be of a structure described with reference to FIGS. 10-12.

According to at least one example embodiment, pillars may be formed of lower pillars and upper pillars as described in relation to FIG. 13. A dummy bit line DBL may not be provided between common source tapping lines CSTL1 and CSTL2 as described in relation to FIG. 14. As described in relation to FIG. 15, a dummy bit line DBL may not be provided between page buffer tapping lines PBTL1 and PBTL2. One common source tapping line may be provided at one common source tapping region as described in relation to FIG. 16. One page buffer tapping line may be provided at one page buffer tapping region as described in relation to FIG. 17. According to at least one example embodiment, as described in relation to FIG. 30, pillars PL may be formed of lower pillars PLa and upper pillars PLb.

Example embodiments are described in relation to common source tapping lines CSTL of a memory cell array 110 and page buffer tapping lines PBTL of a page buffer 130. However, example embodiments of the inventive concepts are not limited thereto. At least one example embodiment of the inventive concepts is applicable to various other constituent elements accessing the memory cell array 110, for example, a sense amplifier, a write driver, and the like.

Figure 33:
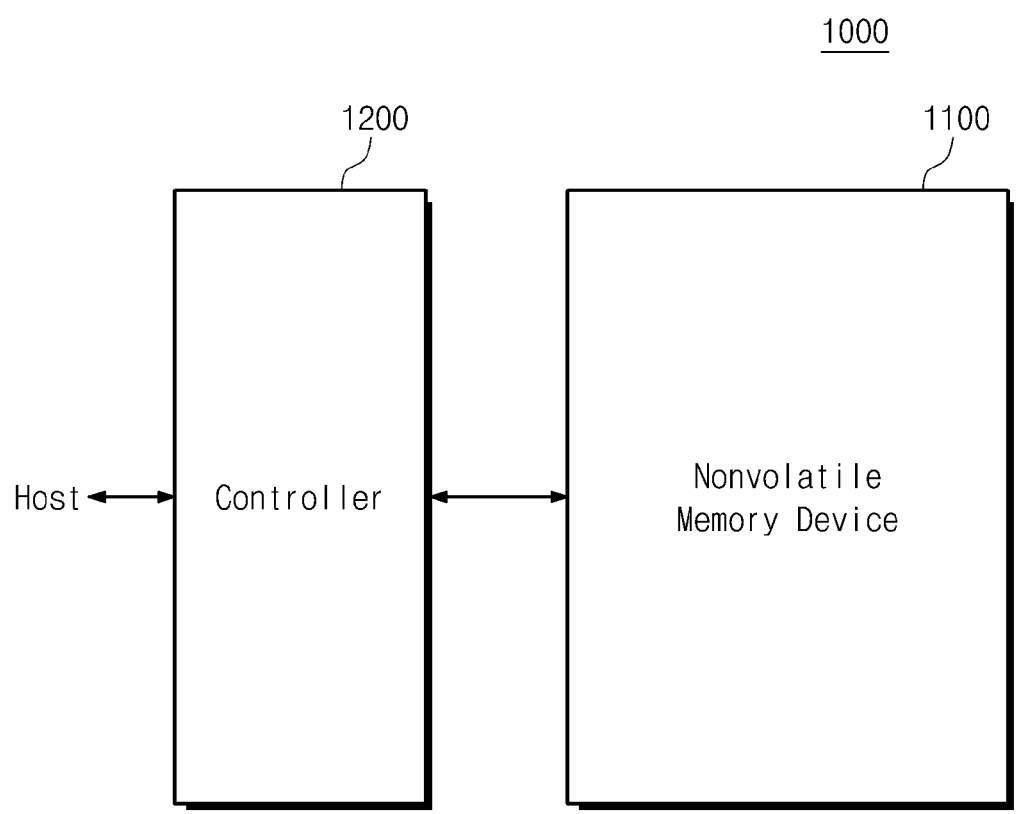

FIG. 33 is a block diagram illustrating memory systems according to at least one example embodiment. Referring to FIG. 33, a memory system 1000 may include a nonvolatile memory device 1100 and a controller 1200. The nonvolatile memory device 1100 may be substantially identical to a nonvolatile memory device 100 according to an example embodiment, for example, as described with respect to FIGS. 1-32. The nonvolatile memory device 1100 may include a plurality of cell strings CS11, CS12, CS21, and CS22 provided on a substrate 111, each cell string including a plurality of cell transistors CT that may be stacked in a direction perpendicular to the substrate 111. A page buffer of the nonvolatile memory device 1100 may include page buffer tapping areas that may be aligned with common source tapping areas.

The controller 1200 may be coupled with a host Host and the nonvolatile memory device 1100. The controller 1200 may be configured to access the nonvolatile memory device 1100 in response to a request from the host Host. The controller 1200 may be configured to control read, program, erase, and/or background operations of the nonvolatile memory portion 1100, for example. The controller 1200 may be configured to provide an interface between the nonvolatile memory portion 1100 and the host. The controller 1200 may be configured to drive firmware for controlling the nonvolatile memory device 1100.

The controller 1200 may be configured to provide a control signal CTRL and an address ADDR to the nonvolatile memory device 1100. The nonvolatile memory device 1100 may be configured to perform read, erase, and/or write operations in response to the control signal CTRL and the address ADDR from the controller 1200. According to at least one example embodiment, the controller 1200 may include constituent elements, for example, a RAM, a processing unit, a host interface, a memory interface, and/or the like. The RAM may be used as at least one of a working memory of the processing unit, a cache memory between the nonvolatile memory portion 1100 and the host Host, and/or a buffer memory between the nonvolatile memory portion 1100 and the host. The processing unit may control an overall operation of the controller 1200.

The host interface may include a protocol for executing data exchange between the host and the controller 1200. For example, the controller 1200 may communicate with an external device (e.g., the host Host) via at least one of various protocols. For example, a USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and/or an IDE (Integrated Drive Electronics) protocol. The memory interface may interface with the nonvolatile memory device 1100. The memory interface may include a NAND interface and/or a NOR interface.

The memory system 1000 may further include an error correction code (ECC) block. The ECC block may be configured to detect and correct an error of data that may be read from the nonvolatile memory device 1100 using ECC. The ECC block may be provided as an element of the controller 1200 or as an element of the nonvolatile memory device 1100.

The controller 1200 and the nonvolatile memory device 1100 may be integrated in a single semiconductor device. The controller 1200 and the nonvolatile memory device 1100 may be integrated in a single semiconductor device so that it may form a memory card. For example, the controller 1200 and the nonvolatile memory device 1100 may be integrated in a single semiconductor device so that they may be a memory card. For example, a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and/or the like.

The controller 1200 and the nonvolatile memory device 1100 may be integrated in a single semiconductor device so that they may be a solid state drive (SSD). The SSD may include a storage device that may be configured to store data in a semiconductor memory. If the memory system 1000 is used as the SSD, it may be possible to improve an operating speed of a host Host coupled with the memory system 1000.

According to at least one example embodiment, the memory system 10 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices that may constitute home network, one of various electronic devices that may constitute computer network, one of various electronic devices that may constitute telematics network, RFID, and/or one of various electronic devices constituting a computing system.

According to at least one example embodiment, a nonvolatile memory device 1100 and/or a memory system 1000 may be packaged by various types of packages, for example, PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and/or the like.

Figure 34:
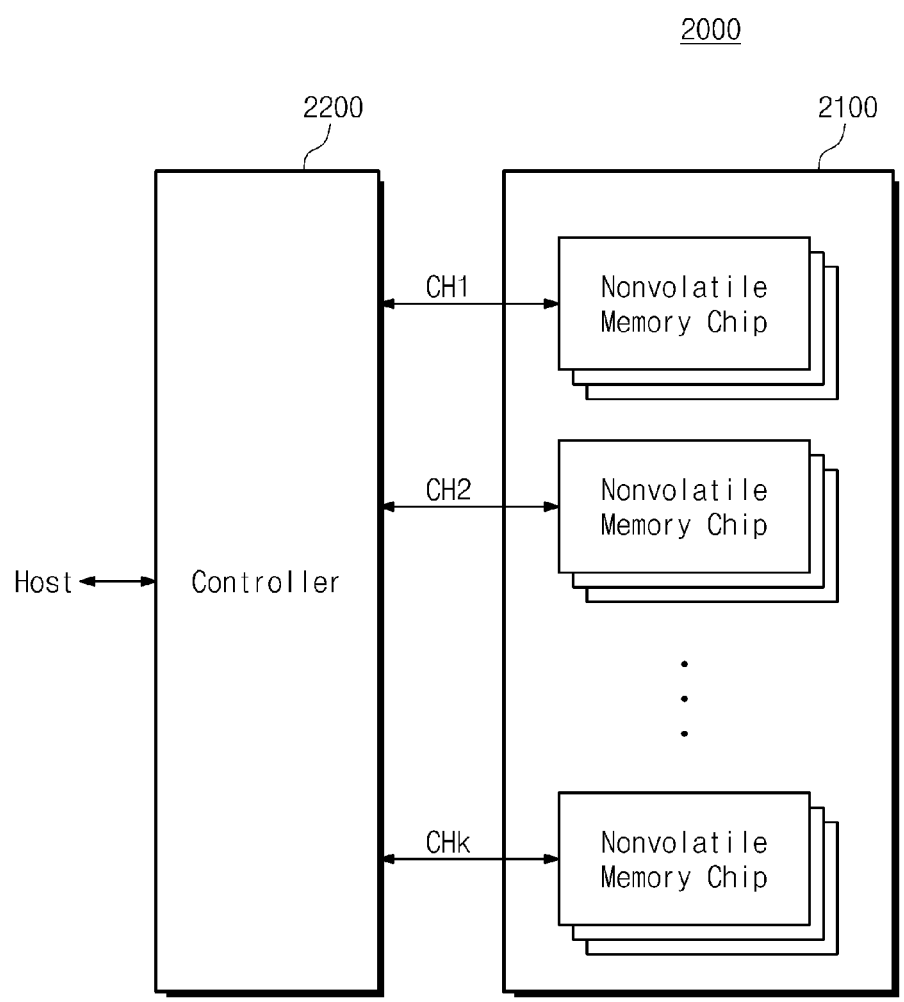

FIG. 34 is a block diagram illustrating applications of a memory system of FIG. 33. Referring to FIG. 34, a memory system 2000 may include a nonvolatile memory device 2100 and a controller 2200. The nonvolatile memory device 2100 may include a plurality of nonvolatile memory chips, which may be classified into a plurality of groups. Nonvolatile memory chips in each group may communicate with the controller 2200 via a common channel. In FIG. 34, there may illustrated a case where a plurality of memory chips communicates with the controller 2200 via plural channels CH1-CHk.

Each nonvolatile memory chip may be configured substantially the same as a nonvolatile memory device 100 according to at least one example embodiment, for example, an example embodiment described with respect to FIGS. 1-32. Each nonvolatile memory chip may include a plurality of cell strings CS11, CS12, CS21, and CS22 that may be provided on a substrate 111. Each cell string that may include a plurality of cell transistors CT that may be stacked in a direction perpendicular to the substrate 111. A page buffer of the nonvolatile memory device 1100 may include page buffer tapping areas aligned with common source tapping areas.

As illustrated in FIG. 34, one channel may be connected with a plurality of nonvolatile memory chips. However, according to example embodiments, the memory system 2000 may be modified such that one channel may be connected with one nonvolatile memory chip.

Figure 35:
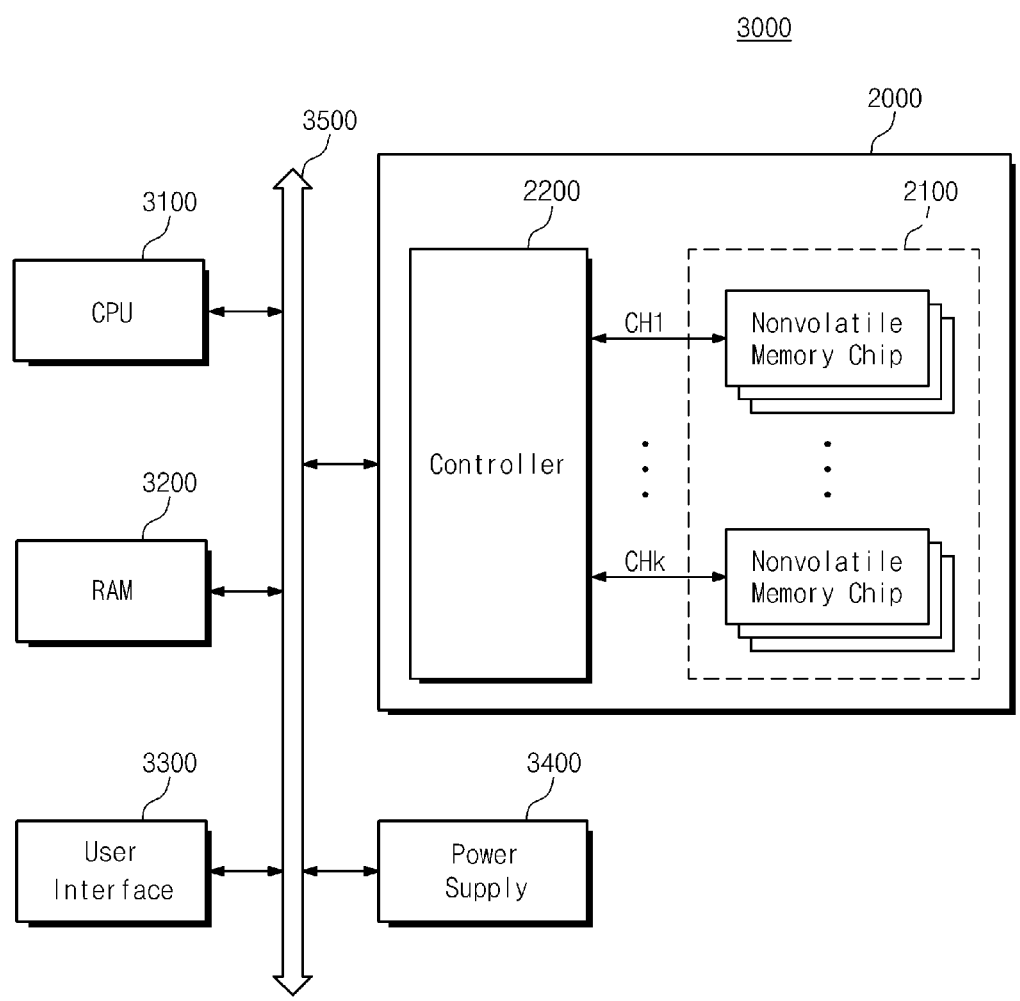

FIG. 35 is a block diagram illustrating computing systems including a memory system of FIG. 34. Referring to FIG. 35, a computing system 3000 may include a CPU 3100, a RAM 3200, a user interface 3300, a power supply 3400, and a memory system 2000. The memory system 2000 may be electrically connected with the CPU 3100, the RAM 3200, the user interface 3300, and the power supply 3400. Data that may be provided via the user interface 3300 or that may be processed by the CPU 3100 may be stored in the memory system 2000.

As illustrated in FIG. 35, a nonvolatile memory device 2100 may be connected with a system bus 3500 via a controller 2200. However, the nonvolatile memory device 2100 may be connected directly with the system bus 3500. The memory system 2000 in FIG. 35 may be a memory system described with respect to FIG. 34. However, the memory system 2000 may be replaced with a memory system 1000 described with reference to FIG. 33. According to at least one example embodiment, the computing system may be configured to include each of memory systems 1000 and 2000 described with reference to FIGS. 33 and 34.

While example embodiments have been particularly shown and described, it will be understood by one of ordinary skill in the art that variations in form and detail may be made therein without departing from the spirit and scope of the claims.

What is claimed is:

1. A nonvolatile memory device, comprising:
   a memory cell array including a plurality of first bit line regions alternating with a plurality of common source tapping regions on a substrate;
   a page buffer including a plurality of second bit line regions aligned with the first bit line regions and a plurality of page buffer tapping regions aligned with the common source tapping regions; and
   a plurality of bit lines spaced apart from one another and extending to the second bit line regions from the first bit line regions.

2. The nonvolatile memory device of claim 1, wherein
   each of the page buffer tapping regions includes at least one page buffer tapping line,
   the page buffer tapping line is in parallel with the plurality of bit lines, and
   the page buffer tapping line is configured to supply power to the page buffer.

3. The nonvolatile memory device of claim 2, wherein the page buffer further includes a plurality of conductive lines spaced apart from one another and extending in a direction perpendicular to the plurality of bit lines, and the conductive lines are connected with the page buffer tapping lines via a plurality of contact plugs.

4. The nonvolatile memory device of claim 2, wherein each of the page buffer tapping regions includes a plurality of page buffer tapping lines, at least one of the page buffer tapping lines configured to supply a power supply voltage and at least one of the page buffer tapping lines configured to supply a ground voltage.

5. The nonvolatile memory device of claim 2, wherein each of the page buffer tapping regions includes a plurality of page buffer tapping lines, and each of the page buffer tapping regions includes a dummy bit line between at least one adjacent pair of the page buffer tapping lines.

6. The nonvolatile memory device of claim 2, wherein each of the page buffer tapping regions includes only one page buffer tapping line, and the nonvolatile memory device is configured to alternately supply a power supply voltage and a ground voltage through the only one page buffer tapping line along a direction perpendicular to the plurality of bit lines.

7. The nonvolatile memory device of claim 1, wherein a width of each of the page buffer tapping regions is one of less than and identical to a width of each of the common source tapping regions.

8. The nonvolatile memory device of claim 1, wherein a width of each of the page buffer tapping regions is 10 times a width of each of the plurality of bit lines.

9. The nonvolatile memory device of claim 1, wherein a width of each of the page buffer tapping regions is 8 times a width of each of the plurality of bit lines.

10. The nonvolatile memory device of claim 1, wherein the memory cell array further includes a plurality of cell strings in each of the first bit line regions, and each of the plurality of cell strings includes a plurality of cell transistors stacked in a direction perpendicular to the substrate.

11. The nonvolatile memory device of claim 10, wherein each of the common source tapping regions includes at least one common source tapping line configured to supply power to a common source line of the plurality of cell strings.

12. The nonvolatile memory device of claim 11, wherein each of the common source tapping regions includes a plurality of common source tapping lines, at least one of the common source tapping lines configured to supply a power supply voltage and at least one of the common source tapping lines configured to supply a ground voltage.

13. The nonvolatile memory device of claim 11, wherein each of the common source tapping regions includes a plurality of common source tapping lines, and each of the common source tapping regions includes a dummy bit line between at least one adjacent pair of common source tapping lines.

14. The nonvolatile memory device of claim 11, wherein each of the common source tapping regions includes only one common source tapping line, and the nonvolatile memory device is configured to alternately supply a power supply voltage and a ground voltage through the only one common source tapping line along a direction perpendicular to the plurality of bit lines.

15. The nonvolatile memory device of claim 11, wherein the common source line includes a plurality of common source regions spaced apart from one another and extending in a direction perpendicular to the plurality of bit lines.

16. A nonvolatile memory device, comprising:
bit line groups alternating with tapping line groups, each of the bit line groups including a plurality of memory cell strings and a plurality of bit lines connected to a page buffer, each of the tapping line groups including
at least one common source tapping line configured to supply power to a common source line connected to the plurality of memory cell strings, and
at least one page buffer tapping line configured to supply power to the page buffer.

17. A nonvolatile memory device, comprising:
a first mesh structure including a plurality of common source regions of a common source line extending in a first direction and a plurality of common source tapping lines extending in a second direction, the common source tapping lines connected to the common source regions at cross points.

18. The nonvolatile memory device of claim 17, further comprising:
a second mesh structure including a plurality of page buffer tapping lines extending in the second direction and a plurality of conductive lines extending in the first direction, the page buffer tapping lines connected to the conductive lines.

19. The nonvolatile memory device of claim 18, wherein the first mesh structure is part of a vertical channel memory array and configured to distribute power across the common source line,
the second mesh structure is part of a page buffer and configured to distribute power across the page buffer, and
the common source tapping lines and the page buffer tapping lines are in a same interconnect level with, and parallel to, a plurality of bit lines.

20. The nonvolatile memory device of claim 18, wherein the first mesh structure is configured to supply an about stable voltage to the common source line, and
the second mesh structure is configured to supply an about stable voltage to an active region of the page buffer.

* * * * *